US012742259B2

(12) United States Patent
Aoyama et al.

(10) Patent No.: US 12,742,259 B2
(45) Date of Patent: Sep. 22, 2026

(54) SEMI-INSULATING GALLIUM ARSENIDE SINGLE-CRYSTAL SUBSTRATE, SUBSTRATE WITH EPITAXIAL LAYER, AND METHOD FOR MANUFACTURING SEMI-INSULATING GALLIUM ARSENIDE SINGLE-CRYSTAL

(71) Applicant: SUMITOMO ELECTRIC INDUSTRIES, LTD., Osaka (JP)

(72) Inventors: Koichiro Aoyama, Hyogo (JP); Katsushi Hashio, Hyogo (JP); Tatsuya Moriwake, Hyogo (JP); Masanori Morishita, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 19/128,587

(22) PCT Filed: Feb. 17, 2023

(86) PCT No.: PCT/JP2023/005704
§ 371 (c)(1),
(2) Date: May 9, 2025

(87) PCT Pub. No.: WO2024/171429
PCT Pub. Date: Aug. 22, 2024

(65) Prior Publication Data
US 2026/0193811 A1 Jul. 9, 2026

(51) Int. Cl.
*B32B 3/02* (2006.01)
*C30B 11/00* (2006.01)
(Continued)

(52) U.S. Cl.
CPC ................ *C30B 29/42* (2013.01); *B32B 3/02* (2013.01); *C30B 11/006* (2013.01); *C30B 11/02* (2013.01)

(58) Field of Classification Search
CPC ..................................................... C30B 29/32
See application file for complete search history.

(56) References Cited

U.S. PATENT DOCUMENTS 11,680,340 B2 * 6/2023 Shetty ..................... C30B 29/42 257/617
12,467,160 B2 * 11/2025 Sunachi .................. C30B 29/42
(Continued)

FOREIGN PATENT DOCUMENTS

JP 10087392 A 4/1998
JP 2004203687 A 7/2004
(Continued)

OTHER PUBLICATIONS

JP 2015-078122 (Year: 2015).*
(Continued)

*Primary Examiner* — Elizabeth E Mulvaney
(74) *Attorney, Agent, or Firm* — Renner, Otto, Boisselle & Sklar, LLP

(57) ABSTRACT

The semi-insulating gallium arsenide single-crystal substrate has a circular-shaped first main surface, in which a diameter of the semi-insulating gallium arsenide single-crystal substrate is 95 mm or more and 205 mm or less, a coefficient of light absorption of the semi-insulating gallium arsenide single-crystal substrate, with respect to near-infrared light at a wavelength of 940 nm, is 1.5 $cm^{-1}$ or less, the number of etch pits per square centimeter, formed on the first main surface, in an etching test with immersion of the semi-insulating gallium arsenide single-crystal substrate in molten potassium hydroxide at 500° C. for 10 minutes is 300 or less, and a specific resistance of the semi-insulating gallium arsenide single-crystal substrate, as measured at 25° C. according to the Van der Pauw method, is $1.0\times10^{8}$ Ω·cm or more.

11 Claims, 6 Drawing Sheets

(51) Int. Cl.

| | |
|---|---|
| ***C30B 11/02*** | (2006.01) |
| ***C30B 29/42*** | (2006.01) |

(56) References Cited

U.S. PATENT DOCUMENTS

| | | | |
|---|---|---|---|
| 2013/0320242 | A1 | 12/2013 | Kretzer et al. |
| 2019/0264348 | A1 | 8/2019 | Fukunaga et al. |
| 2020/0190696 | A1 | 6/2020 | Shetty et al. |
| 2020/0190697 | A1 | 6/2020 | Shetty et al. |
| 2021/0190697 | A1 | 6/2021 | Iftime et al. |
| 2021/0310155 | A1 | 10/2021 | Fukunaga et al. |

FOREIGN PATENT DOCUMENTS

| | | | |
|---|---|---|---|
| JP | 2006117464 | A | 5/2006 |
| JP | 2006232574 | A | 9/2006 |
| WO | 2010/024230 | A1 | 3/2010 |
| WO | 2019008663 | A1 | 1/2019 |
| WO | 2021005731 | A1 | 1/2021 |

OTHER PUBLICATIONS

Schaefer, S.T. et al., "Absorption edge characteristics of GaAs, GaSb, InAs, and InSb", Journal of Applied Physics, Apr. 29, 2020, 127, p. 165705-1-p. 165705-14.

* cited by examiner

SEMI-INSULATING GALLIUM ARSENIDE SINGLE-CRYSTAL SUBSTRATE, SUBSTRATE WITH EPITAXIAL LAYER, AND METHOD FOR MANUFACTURING SEMI-INSULATING GALLIUM ARSENIDE SINGLE-CRYSTAL

This application is a national phase of International Application No. PCT/JP2023/005704 filed Feb. 17, 2023, which is hereby incorporated herein by reference in its entirety.

TECHNICAL FIELD

The present disclosure relates to a semi-insulating gallium arsenide single-crystal substrate, a substrate with an epitaxial layer and a method for manufacturing a semi-insulating gallium arsenide single crystal.

BACKGROUND ART

U.S. Patent Publication No. 2020/0190696 (PTL 1) and U.S. Patent Publication No. 2020/0190697 (PTL 2) disclose the following features of a gallium arsenide single-crystal substrate that can be applied to an optical device. In other words, PTL 1 and PTL 2 respectively disclose a gallium arsenide single-crystal substrate in which the coefficient of light absorption with respect to near-infrared light at a wavelength of 940 nm is 3 $cm^{-1}$ or less and the etch pit density (hereinafter, also designated as "EPD") being the number of etch pits per square centimeter formed on a main surface in an etching test, is 1000 $cm^{-2}$ or less, and a gallium arsenide single-crystal substrate in which the coefficient of light absorption is 6 $cm^{-1}$ and the EPD is 500 $cm^{-2}$ or less. U.S. Patent Publication No. 2013/0320242 (PTL 3) discloses a doped gallium arsenide single crystal in which the coefficient of light absorption with respect to near-infrared light at a wavelength of 1000 nm is 2 $cm^{-1}$ or less and the single crystal has a low coefficient of light absorption allowing for application to an optical device. WO 2019/008663 (PTL 4) discloses a gallium arsenide single-crystal substrate in which the EPD is 10 $cm^{-2}$ or more and 10000 $cm^{-2}$ or less and efficient adjustment of insulating properties or conductive properties can be made.

CITATION LIST

Patent Literature

PTL 1: U.S. Patent Publication No. 2020/0190696
PTL 2: U.S. Patent Publication No. 2020/0190697
PTL 3. U.S. Patent Publication No. 2013/0320242
PTL 4: WO 2019/008663

SUMMARY OF INVENTION

The semi-insulating gallium arsenide single-crystal substrate according to the present disclosure is a semi-insulating gallium arsenide single-crystal substrate having a circular-shaped first main surface. A diameter of the semi-insulating gallium arsenide single-crystal substrate is 95 mm or more and 205 mm or less. A coefficient of light absorption of the semi-insulating gallium arsenide single-crystal substrate, with respect to near-infrared light at a wavelength of 940 nm, is 1.5 $cm^{-1}$ or less. The number of etch pits per square centimeter, formed on the first main surface, in an etching test with immersion of the semi-insulating gallium arsenide single-crystal substrate in molten potassium hydroxide at 500° C. for 10 minutes is 300 or less. A specific resistance of the semi-insulating gallium arsenide single-crystal substrate, as measured at 25° C. in Hall measurement according to the Van der Pauw method, is $1.0\times10^8$ Ω·cm or more.

The substrate with an epitaxial layer according to the present disclosure includes the semi-insulating gallium arsenide single-crystal substrate, and an epitaxial layer placed on the first main surface. The epitaxial layer includes an infrared emission layer.

The method for manufacturing a semi-insulating gallium arsenide single crystal according to the present disclosure is a method for manufacturing a semi-insulating gallium arsenide single crystal by use of a vertical boat method, the manufacturing method including preparing a single crystal growth apparatus including at least a cylindrical crucible and a heating element that heats the crucible, receiving a seed crystal at a bottom portion of the crucible and receiving gallium arsenide bulk at an upper portion as compared with the seed crystal in the crucible, heating the crucible by the heating element to partially melt the gallium arsenide and the seed crystal, thereby not only obtaining a gallium arsenide melt, but also contacting the gallium arsenide melt and a residue of the seed crystal, and growing a crystal on the seed crystal in the gallium arsenide melt to obtain a semi-insulating gallium arsenide single crystal. The obtaining a semi-insulating gallium arsenide single crystal is carried out with a relationship among the following formula 4, formula 5 and formula 6 being satisfied:

$$0.20°\text{ C./mm} \le X \le 0.30°\text{ C./mm} \quad \text{Formula 4}$$

$$X + 0.0012°\text{ C./mm}^2 \times Y \le Z1 \le X + 0.0024°\text{ C./mm}^2 \times Y \quad \text{Formula 5}$$

$$0.26°\text{ C./mm} \le Z2 \le 0.42°\text{ C./mm} \quad \text{Formula 6}$$

in the formula 4, formula 5 and formula 6,

X represents a temperature gradient along an axial direction of the crucible, as measured with, as a center, an interface between the crystal and the gallium arsenide melt, and a unit of the temperature gradient is ° C./mm, Y represents a distance from the interface to a first reference point in the crystal, and a unit of the distance is mm, Z1 represents a temperature gradient along an axial direction of the crucible, as measured with the first reference point as a center, and a unit of the temperature gradient is ° C./mm, and Z2 represents a temperature gradient along an axial direction of the crucible, as measured with, as a center, the first reference point at a distance from the interface to the first reference point, of 50 mm, and a unit of the temperature gradient is ° C./mm.

BRIEF DESCRIPTION OF DRAWINGS

FIG. 5 is an illustrative diagram that describes a substrate with an epitaxial layer according to the present embodiment.

DETAILED DESCRIPTION

Figure 1:
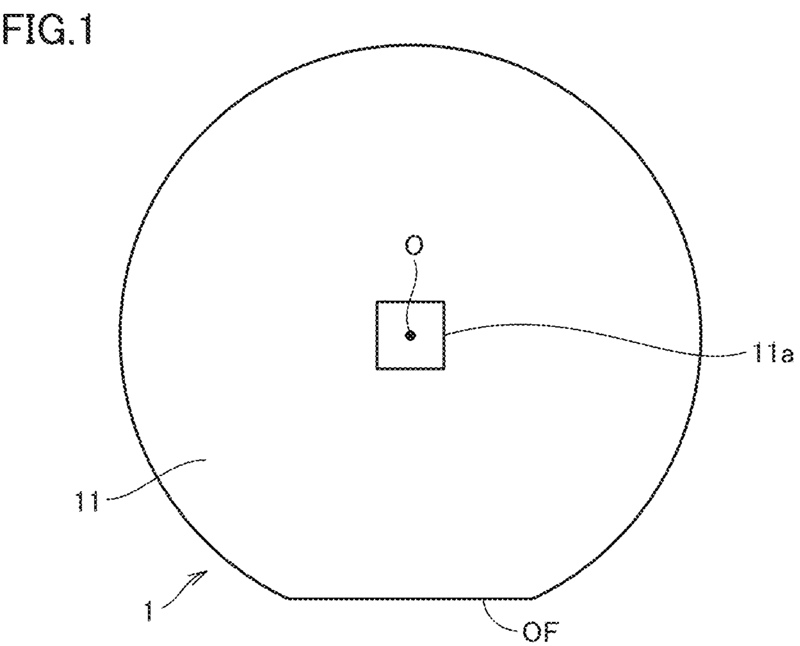
FIG. 1 is an illustrative diagram that describes a location to be measured (region to be measured) for measuring each characteristic of the coefficient of light absorption and the EL2 concentration of a semi-insulating gallium arsenide single-crystal substrate according to the present embodiment.

Problem to be Solved by the Present Disclosure

In recent years, in the case of application of gallium arsenide single-crystal substrates as substrates for use in optical devices, in particular, vertical cavity surface emitting lasers (hereinafter, also designated as "VCSELs") and the like, severer performance in terms of high transmission ability with respect to near-infrared light and low dislocation ability have been demanded. For example, the gallium arsenide single-crystal substrates of PTL 1 and PTL 2 are demanded to be smaller in coefficient of light absorption with respect to near-infrared light or lower in EPD. The gallium arsenide single-crystal substrate of PTL 3 is demanded to not only be smaller in coefficient of light absorption with respect to near-infrared light, but also lower in EPD. The gallium arsenide single-crystal substrate of PTL 4 is not prescribed about the coefficient of light absorption with respect to near-infrared light in the case of application thereof to an optical device, but at least a gallium arsenide single-crystal substrate classified to semi-insulating substrate high in resistance is demanded to be lower in EPD. There has not been thus realized any semi-insulating gallium arsenide single-crystal substrate for an optical device such as VCSEL, which satisfies both characteristics of low coefficient of light absorption and low EPD with respect to near-infrared light, and there is desired development of such any substrate.

In view of the above viewpoints, an object of the present disclosure is to provide a semi-insulating gallium arsenide single-crystal substrate, a substrate with an epitaxial layer and a method for manufacturing a semi-insulating gallium arsenide single crystal, which are suitable for an optical device demanded to have high transmission ability with respect to near-infrared light and low dislocation ability, such as a VCSEL.

Advantageous Effect of the Present Disclosure

According to the foregoing, it is possible to provide a semi-insulating gallium arsenide single-crystal substrate, a substrate with an epitaxial layer and a method for manufacturing a semi-insulating gallium arsenide single crystal, which are suitable for an optical device demanded to have high transmission ability with respect to near-infrared light and low dislocation ability, such as a VCSEL.

DESCRIPTION OF EMBODIMENTS

First, an outline of an embodiment of the present disclosure is described. The present inventors have made intensive studies in order to solve the above problems, and have completed the present disclosure. First, the present inventors have focused on the following: not only a carrier concentration is kept low to allow high transmission ability with respect to near-infrared light to be achieved in a semi-insulating gallium arsenide single-crystal substrate, but also frequent occurrence of dislocation, feared in the case of a low carrier concentration kept, is suppressed by devising a method for manufacturing a semi-insulating gallium arsenide single crystal. In particular, the inventors have manufactured a semi-insulating gallium arsenide single crystal with suppression of the occurrence of dislocation as much as possible, by critically controlling the temperature of growth of the semi-insulating gallium arsenide single crystal under specific conditions in the course of manufacturing the semi-insulating gallium arsenide single crystal with a vertical boat method. It has been thus found that a semi-insulating gallium arsenide single crystal with low dislocation is obtained regardless of a low carrier concentration. Therefore, a semi-insulating gallium arsenide single-crystal substrate suitable for an optical device demanded to have high transmission ability with respect to near-infrared light and low dislocation ability, such as a VCSEL, has been achieved, and the present disclosure has been completed.

Next, aspects for carrying out the present disclosure are recited and described.

[1] A semi-insulating gallium arsenide single-crystal substrate according to one aspect of the present disclosure is a semi-insulating gallium arsenide single-crystal substrate having a circular-shaped first main surface. A diameter of the semi-insulating gallium arsenide single-crystal substrate is 95 mm or more and 205 mm or less. A coefficient of light absorption of the semi-insulating gallium arsenide single-crystal substrate, with respect to near-infrared light at a wavelength of 940 nm, is 1.5 $cm^{-1}$ or less. The number of etch pits per square centimeter, formed on the first main surface, in an etching test with immersion of the semi-insulating gallium arsenide single-crystal substrate in molten potassium hydroxide at 500° C. for 10 minutes is 300 or less. A specific resistance of the semi-insulating gallium arsenide single-crystal substrate, as measured at 25° C. in Hall measurement according to the Van der Pauw method, is $1.0\times10^{8}$ Ω·cm or more. The semi-insulating gallium arsenide single-crystal substrate having such features is sufficiently small in coefficient of light absorption with respect to near-infrared light and also sufficiently low in EPD, and thus can include both characteristics of high transmission ability with respect to near-infrared light and low dislocation ability. Therefore, the present disclosure can provide a semi-insulating gallium arsenide single-crystal substrate suitable for an optical device such as a VCSEL.

[2] The coefficient of light absorption is preferably determined by applying the near-infrared light at a wavelength of 940 nm to the semi-insulating gallium arsenide single-crystal substrate at an angle of 85 degrees to measure a transmittance and a reflectance of the near-infrared light, of the semi-insulating gallium arsenide single-crystal substrate, with an ultraviolet-visible-infrared spectrophotometer, and assigning a numerical value of the transmittance and a numerical value of the reflectance, and a numerical value of a thickness of the semi-insulating gallium arsenide single-crystal substrate to the following expression 1, expression 2 and expression 3, and is preferably determined together with a reflectance in one reflection of the near-infrared light in the semi-insulating gallium arsenide single-crystal substrate.

$$R+R(1-R)^2\exp(-2\alpha d)/(1-r)=R^* \quad \text{Expression 1}$$

$$(1-R)^2\exp(-\alpha d)/(1-r)=T \quad \text{Expression 2}$$

$$r=R^2\exp(2\alpha d) \quad \text{Expression 3}$$

In the expression 1, expression 2 and expression 3,

R* represents a reflectance in consideration of multiple reflections, as measured with the ultraviolet-visible-infrared spectrophotometer, and a unit of the reflectance is dimensionless.

T* represents a transmittance in consideration of multiple reflections, as measured with the ultraviolet-visible-infrared spectrophotometer, and a unit of the transmittance is dimensionless.

α represents the coefficient of light absorption, and a unit of the coefficient of light absorption is $cm^{-1}$.

R represents a reflectance in one reflection of the near-infrared light in the semi-insulating gallium arsenide single-crystal substrate, and a unit of the reflectance in one reflection is dimensionless.

d represents a thickness of the semi-insulating gallium arsenide single-crystal substrate, and a unit of the thickness is cm.

Thus, a semi-insulating gallium arsenide single-crystal substrate can be provided which is sufficiently small in coefficient of light absorption with respect to near-infrared light and which has high transmission ability with respect to near-infrared light.

[3] A carrier concentration in the semi-insulating gallium arsenide single-crystal substrate, as measured at 25° C. in Hall measurement according to the Van der Pauw method, is preferably $8.0\times10^6/cm^3$ or less. An electron mobility of the semi-insulating gallium arsenide single-crystal substrate, as measured at 25° C. in Hall measurement according to the Van der Pauw method, is preferably 4500 $cm^2/V\cdot s$ or more. Thus, it is possible to include higher transmission ability with respect to near-infrared light.

[4] An average value of a residual strain, as an absolute value of a difference between a strain along a radial direction of the first main surface and a strain along a tangential direction of the first main surface, is preferably $5.0\times10^{-6}$ or less. Thus, a semi-insulating gallium arsenide single-crystal substrate hardly cracked in a manufacturing process can be provided.

[5] An EL2 concentration of the semi-insulating gallium arsenide single-crystal substrate is preferably $7.5\times10^{15}$ $cm^{-3}$ or more and $1.0\times10^{16}$ $cm^{-3}$ or less. Thus, it is possible to include higher transmission ability with respect to near-infrared light.

[6] Preferably, the semi-insulating gallium arsenide single-crystal substrate contains carbon, and an atomic concentration of the carbon in the semi-insulating gallium arsenide single-crystal substrate is $5.0\times10^{15}$ $cm^{-3}$ or more and $1.2\times10^{16}$ $cm^{-3}$ or less. Thus, it is possible to include higher transmission ability with respect to near-infrared light.

[7] The semi-insulating gallium arsenide single-crystal substrate is preferably used in a vertical cavity surface emitting laser. Thus, the manufacturing yield of an optical device such as a VCSEL can be significantly enhanced. Herein, the "manufacturing yield" means not only characteristics demanded, such as high transmission ability with respect to near-infrared light and low dislocation ability, but also the efficiency at which a product having sufficient operation reliability and sufficient lifetime can be manufactured.

[8] A substrate with an epitaxial layer according to one aspect of the present disclosure includes the semi-insulating gallium arsenide single-crystal substrate, and an epitaxial layer placed on the first main surface. The epitaxial layer includes an infrared emission layer. The substrate with the epitaxial layer, having such features, can allow a substrate with an epitaxial layer suitable for an optical device such as a VCSEL to be provided by both characteristics of high transmission ability with respect to near-infrared light and low dislocation ability included in the semi-insulating gallium arsenide single-crystal substrate.

[9] A method for manufacturing a semi-insulating gallium arsenide single crystal according to one aspect of the present disclosure is a method for manufacturing a semi-insulating gallium arsenide single crystal by use of a vertical boat method, the manufacturing method including preparing a single crystal growth apparatus including at least a cylindrical crucible and a heating element that heats the crucible, receiving a seed crystal at a bottom portion of the crucible and receiving gallium arsenide bulk at an upper portion as compared with the seed crystal in the crucible, heating the crucible by the heating element to partially melt the gallium arsenide and the seed crystal, thereby not only obtaining a gallium arsenide melt, but also contacting the gallium arsenide melt and a residue of the seed crystal, and growing a crystal on the seed crystal in the gallium arsenide melt to obtain a semi-insulating gallium arsenide single crystal. The obtaining a semi-insulating gallium arsenide single crystal is carried out with a relationship among the following formula 4, formula 5 and formula 6 being satisfied.

$$0.20°\ C./mm \le X \le 0.30°\ C./mm \quad \text{Formula 4}$$

$$X+0.0012°\ C./mm^2\times Y \le Z1 \le X+0.0024°\ C./mm^2\times Y \quad \text{Formula 5}$$

$$0.26°\ C./mm \le Z2 \le 0.42°\ C./mm \quad \text{Formula 6}$$

In the formula 4, formula 5 and formula 6,

X represents a temperature gradient along an axial direction of the crucible, as measured with, as a center, an interface between the crystal and the gallium arsenide melt, and a unit of the temperature gradient is ° C./mm.

Y represents a distance from the interface to a first reference point in the crystal, and a unit of the distance is mm.

Z1 represents a temperature gradient along an axial direction of the crucible, as measured with the first reference point as a center, and a unit of the temperature gradient is ° C./mm.

Z2 represents a temperature gradient along an axial direction of the crucible, as measured with, as a center, the first reference point at a distance from the interface to the first reference point, of 50 mm, and a unit of the temperature gradient is ° C./mm.

According to the manufacturing method having such features, it is possible to obtain a semi-insulating gallium arsenide single-crystal substrate that includes both characteristics of high transmission ability with respect to near-infrared light and low dislocation ability and therefore is suitable for an optical device such as a VCSEL.

The single crystal growth apparatus preferably includes one or more thermocouples outside in a radial direction of the crucible. The thermocouple(s) is (are) preferably movable in a direction in parallel with an axial direction of the crucible. Thus, the manufacturing yield can be enhanced.

DETAIL OF EMBODIMENTS

Hereinafter, one embodiment according to the present disclosure (hereinafter, also designated as "the present embodiment") is described in further detail, but the present disclosure is not limited thereto. While the description may be hereinafter made with reference to the drawings, the same or corresponding element in the present specification and the drawings is marked with the same symbol and the same description about the same or corresponding element is not repeated. In the drawings, a scale size is appropriately adjusted and illustrated in order to facilitate understanding of each component, and the scale size of each component illustrated in the drawings and the scale size of an actual component are not necessarily matched.

Herein, the designation of the format "A to B" means the upper and lower limits of a range (namely, A or more and B or less), and, in a case where the unit of A is not described and only the unit of B is described, the unit of A and the unit of B are the same. Furthermore, in a case where a compound or the like is herein represented by chemical formula and also no atomic ratio is particularly limited, any conventionally known atomic ratio is meant to be included and there is not necessarily limited to only any stoichiometric range. For example, in the case of the description "GaAs", the ratio of the number of atoms constituting GaAs is not limited to Ga:As=1:1, and any conventionally known atomic ratio is included.

The "first main surface" of the semi-insulating gallium arsenide single-crystal substrate herein refers to one of two circular main surfaces of the substrate, and in particular, means a main surface on which, for example, an infrared emission layer is to be placed as an epitaxial layer in the case of formation of a substrate with an epitaxial layer described below from the semi-insulating gallium arsenide single-crystal substrate. In this regard, other main surface being not the "first main surface" of two circular main surfaces of the substrate herein refers to "second main surface". The "semi-insulating" in the semi-insulating gallium arsenide single-crystal substrate herein means electrical characteristics of a gallium arsenide single-crystal substrate having high resistance and exhibiting a value of specific resistance of $1.0\times10^{7}$ Ω·cm or more.

Furthermore, in a case where a diameter of the semi-insulating gallium arsenide single-crystal substrate is described to be "100 mm", the diameter means approximately 100 mm (about 95 to 105 mm), or means 4 inches. In a case where the diameter is described to be "150 mm", the diameter means approximately 150 mm (about 145 to 155 mm), or means 6 inches. In a case where the diameter is described to be "200 mm", the diameter means approximately 200 mm (about 195 to 205 mm), or means 8 inches. The diameter of the semi-insulating gallium arsenide single-crystal substrate can be measured with a conventionally known external-diameter measuring instrument such as a caliper.

The semi-insulating gallium arsenide single-crystal substrate has a "circular-shaped" first main surface. The "circular-shaped" expressing the shape of the first main surface herein not only includes a geometric circular shape, but also includes a shape in the case of no formation of any geometric circular shape by the first main surface due to formation of at least any of a notch, an orientation flat (hereinafter, also designated as "OF") or an index flat (hereinafter, also designated as "IF"). In other words, the "shape in the case of no formation of any geometric circular shape by the first main surface" means a shape in the case of a shortened length of a line segment extending from any point on the notch, OF and IF to the center of the first main surface among line segments each extending from any point on an outer circumference of the first main surface to the center of the first main surface. That is, the first main surface is herein assumed to have a shape that is a "circular shape" based on a shape before formation of the notch, OF, IF and the like. Therefore, the center of the first main surface and the diameter of the semi-insulating gallium arsenide single-crystal substrate are to be determined as a position and a size (length) based on a circular shape before formation of the notch, OF, IF, and the like. The "shape in the case of no formation of any geometric circular shape by the first main surface" here also includes a shape in the case of the lengths of all line segments each extending from any point on an outer circumference of the first main surface to the center of the first main surface being not necessarily identical due to the shape of a semi-insulating gallium arsenide single crystal before cutting of the single crystal into a semi-insulating gallium arsenide single-crystal substrate. In this case, the center of the first main surface refers to a position of the center of gravity, and the diameter of the semi-insulating gallium arsenide single-crystal substrate refers to the length of the longest line segment among line segments each extending from any point on an outer circumference of the semi-insulating gallium arsenide single-crystal substrate through the center of the first main surface to another point on the outer circumference.

An individual orientation is indicated by [ ], a collective orientation is indicated by < >, an individual plane is indicated by ( ), and a collective plane is indicated by { }, herein respectively, in the crystallographic description. A crystallographic index being negative, while is usually expressed by applying "—(bar)" as a superscript of a number, is herein designated by applying a minus sign in front of a number.

[Semi-Insulating Gallium Arsenide Single-Crystal Substrate]

A semi-insulating gallium arsenide single-crystal substrate according to the present embodiment (hereinafter, also designated as "semi-insulating GaAs single-crystal substrate") is a semi-insulating GaAs single-crystal substrate having a circular-shaped first main surface. The diameter of the semi-insulating GaAs single-crystal substrate is 95 mm or more and 205 mm or less. The coefficient of light absorption of the semi-insulating GaAs single-crystal substrate with respect to near-infrared light at a wavelength of 940 nm is 1.5 $cm^{-1}$ or less. The number of etch pits per square centimeter, formed on the first main surface, in an etching test with immersion of the semi-insulating GaAs single-crystal substrate in molten potassium hydroxide at 500° C. for 10 minutes is 300 or less. Furthermore, the specific resistance of the semi-insulating GaAs single-crystal substrate, as measured at 25° C. in Hall measurement according to the Van der Pauw method, is $1.0\times10^8$ Ω·cm or more. The semi-insulating GaAs single-crystal substrate having such features is sufficiently small in coefficient of light absorption with respect to near-infrared light and also sufficiently low in EPD, and thus can include both characteristics of high transmission ability with respect to near-infrared light and low dislocation ability. Therefore, the present embodiment can provide a semi-insulating GaAs single-crystal substrate suitable for an optical device such as a VCSEL.

The reason why the semi-insulating GaAs single-crystal substrate according to the present embodiment can include both characteristics of high transmission ability with respect to near-infrared light and low dislocation ability is based on the following features. Namely, the reason why a semi-insulating GaAs single-crystal substrate of high resistance has been conventionally adopted as a material for an optical device such as a VCSEL is because, for example, a semi-insulating GaAs single-crystal substrate low in carrier concentration is generally small in coefficient of absorption with respect to near-infrared light and therefore exhibits high transmission ability with respect to near-infrared light. However, a semi-insulating GaAs single-crystal substrate low in carrier concentration often has a high EPD because much dislocation is present in a single crystal. In a case where such a semi-insulating GaAs single-crystal substrate is applied to an optical device such as a VCSEL, a problem is that there are caused an inferior yield and lack of operation reliability or a low lifetime.

A method for introducing a metal atom such as silicon as an impurity (dopant) into such a semi-insulating GaAs single-crystal substrate is known in order to decrease the EPD of the substrate. However, such a semi-insulating GaAs single-crystal substrate tends to be reduced in specific resistance due to introduction of such an impurity, and may be difficult to apply to an optical device. Furthermore, if the carrier concentration is higher due to introduction of such an impurity, the coefficient of absorption with respect to near-infrared light also tends to be larger. While it is considered that two different impurities are introduced to decrease the EPD and reduce the carrier concentration, thereby allowing such a semi-insulating GaAs single-crystal substrate to be smaller in coefficient of absorption, such a case causes an extreme reduction in electron mobility and thus has a risk of making application to an optical device difficult. In other words, it has been desired, but technically difficult to obtain a semi-insulating GaAs single-crystal substrate that has characteristics including sufficiently low coefficient of light absorption with respect to near-infrared light and EPD and also high resistance and thus is suitable for an optical device.

The present inventors have focused on a reduction in EPD in a semi-insulating GaAs single-crystal substrate that is low in carrier concentration and small in coefficient of absorption with respect to near-infrared light to exhibit high transmission ability with respect to near-infrared light, without any resource to introduction of an impurity. Specifically, a semi-insulating gallium arsenide single crystal (hereinafter, also designated as "semi-insulating GaAs single crystal") has been manufactured with suppression of the occurrence of dislocation as much as possible, by critically controlling the temperature of growth of the semi-insulating GaAs single crystal in the course of manufacturing the semi-insulating GaAs single crystal with a vertical boat method. In particular, critical control has been made so as to allow not only the temperature of an interface between a solidified semi-insulating GaAs single crystal and a gallium arsenide melt in contact with this semi-insulating GaAs single crystal, but also the temperature in the solidified semi-insulating GaAs single crystal to correspond to a temperature gradient derived from a predetermined condition expression. It has been thus conceived that a semi-insulating GaAs single crystal with low dislocation (specifically, an EPD of 300 $cm^{-2}$ or less) is obtained regardless of a low carrier concentration. From the foregoing, a semi-insulating GaAs single-crystal substrate according to the present embodiment can be sufficiently small in coefficient of light absorption with respect to near-infrared light and sufficiently low in EPD, and therefore can include both characteristics of high transmission ability with respect to near-infrared light and low dislocation ability.

<First Main Surface>

The semi-insulating GaAs single-crystal substrate has a circular-shaped first main surface. The first main surface means, as described above, a main surface of two circular main surfaces of the substrate, on which, for example, an infrared emission layer is to be placed as an epitaxial layer in the case of formation of a substrate with an epitaxial layer. The first main surface is preferably a mirror surface in which the surface roughness represented by the arithmetic average roughness (Ra) is 1 nm or less, as described below.

<Diameter>

The diameter of the semi-insulating GaAs single-crystal substrate is 95 mm or more and 205 mm or less. The semi-insulating GaAs single-crystal substrate having a diameter of 95 mm or more and 205 mm or less preferably refers to one having specifically a diameter of 100 mm, 150 mm or 200 mm, in other words, a diameter of 4 inches, 6 inches or 8 inches. Thus, a large-diameter semi-insulating GaAs single-crystal substrate having a diameter of 95 mm or more and 205 mm or less can include both characteristics of high transmission ability with respect to near-infrared light and low dislocation ability. As described above, the diameter of the semi-insulating GaAs single-crystal substrate can be measured with a conventionally known external-diameter measuring instrument such as a caliper.

<Each Characteristic of Coefficient of Light Absorption, EPD, Specific Resistance, and the Like>

Figure 2:
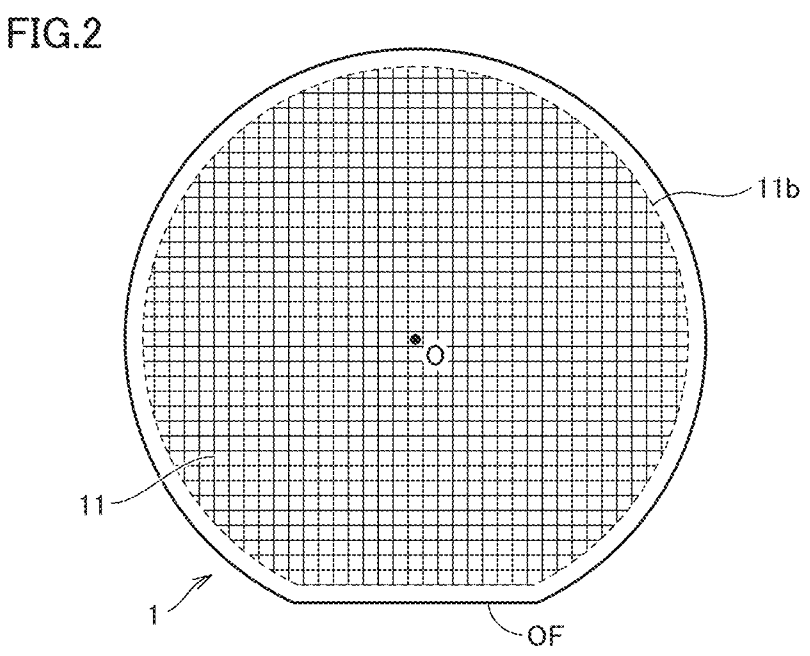
FIG. 2 is an illustrative diagram that describes a measurement point (measurement region) for measuring the etch pit density of a semi-insulating gallium arsenide single-crystal substrate according to the present embodiment.
Figure 3:
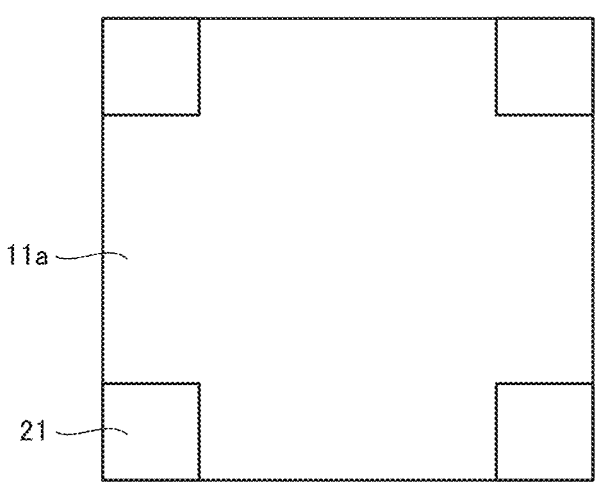
FIG. 3 is an illustrative diagram that describes a sample for Hall measurement, the sample being produced with a central portion of a semi-insulating gallium arsenide single-crystal substrate according to the present embodiment in order to measure each characteristic of the specific resistance, the carrier concentration and the electron mobility of the semi-insulating gallium arsenide single-crystal substrate.

In the present embodiment, the coefficient of light absorption of the semi-insulating GaAs single-crystal substrate with respect to near-infrared light at a wavelength of 940 nm is 1.5 $cm^{-1}$ or less. The number of etch pits per square centimeter, formed on the first main surface, in an etching test with immersion of the semi-insulating GaAs single-crystal substrate in molten potassium hydroxide at 500° C. for 10 minutes is 300 or less. Furthermore, the specific resistance of the semi-insulating GaAs single-crystal substrate, as measured at 25° C. in Hall measurement according to the Van der Pauw method, is $1.0\times10^{8}$ Ω·cm or more. Hereinafter, each characteristic of the coefficient of light absorption with respect to near-infrared light at a wavelength of 940 nm, EPD specific resistance, and the like, as measured in the semi-insulating GaAs single-crystal substrate, is described with reference to FIG. 1 to FIG. 3. FIG. 1 is an illustrative diagram that describes a location to be measured (region to be measured) for measuring each characteristic of the coefficient of light absorption and the EL2 concentration of a semi-insulating gallium arsenide single-crystal substrate according to the present embodiment. FIG. 2 is an illustrative diagram that describes a measurement point (measurement region) for measuring the etch pit density of a semi-insulating gallium arsenide single-crystal substrate according to the present embodiment. FIG. 3 is an illustrative diagram that describes a sample for Hall measurement, the sample being produced with a central portion of a semi-insulating gallium arsenide single-crystal substrate according to the present embodiment in order to measure each characteristic of the specific resistance, the carrier concentration and the electron mobility of the semi-insulating gallium arsenide single-crystal substrate.

(Coefficient of Light Absorption)

In the present embodiment, the coefficient of light absorption of the semi-insulating GaAs single-crystal substrate with respect to near-infrared light at a wavelength of 940 nm is 1.5 $cm^{-1}$ or less. Specifically, the coefficient of light absorption with respect to near-infrared light at a wavelength of 940 nm, determined with the center of the semi-insulating GaAs single-crystal substrate, as a measurement object, exhibits a value of 1.5 $cm^{-1}$ or less. The coefficient of light absorption is preferably 1.3 $cm^{-1}$ or less, more preferably 1.25 $cm^{-1}$ or less, and most preferably less than 1.25 $cm^{-1}$. Thus, it is possible to include sufficient transmission ability with respect to near-infrared light. In a case where the coefficient of light absorption is more than 1.5 $cm^{-1}$, the semi-insulating GaAs single-crystal substrate more highly tends to absorb near-infrared light and thus has a difficulty in including sufficient transmission ability with respect to near-infrared light. A smaller numerical value of the coefficient of light absorption more leads to an enhancement in transmission ability, and thus the lower limit value is not required to be limited, but the coefficient of light absorption is usually 0.01 $cm^{-1}$ or more.

The coefficient of light absorption can be determined by a conventionally known method, from the transmittance and the reflectance of light of a substance, as measured with an ultraviolet-visible-infrared spectrophotometer or the like. Here, in a case where the transmittance and the reflectance of light of the semi-insulating GaAs single-crystal substrate are obtained with an ultraviolet-visible-infrared spectrophotometer or the like, the occurrence of multiple reflections between parallel two main surfaces is required to be considered, and thus the coefficient of light absorption is preferably determined by the following method. Specifically, the coefficient of light absorption is preferably determined by applying the near-infrared light at a wavelength of 940 nm to the semi-insulating GaAs single-crystal substrate at an angle of 85 degrees to measure the transmittance and the reflectance of the near-infrared light, of the semi-insulating GaAs single-crystal substrate, with an ultraviolet-visible-infrared spectrophotometer, and assigning the numerical value of the transmittance and the numerical value of the reflectance, and the numerical value of the thickness of the semi-insulating GaAs single-crystal substrate to the following expression 1, expression 2 and expression 3, and is preferably determined together with a reflectance in one reflection of the near-infrared light in the semi-insulating GaAs single-crystal substrate.

$$R+R(1-R)^2\exp(-2\alpha d)/(1-r)=R^* \qquad \text{Expression 1}$$

$$(1-R)^2\exp(-\alpha d)/(1-r)=T \qquad \text{Expression 2}$$

$$r=R^2\exp(2\alpha d) \qquad \text{Expression 3}$$

In the expression 1, expression 2 and expression 3,

R* represents the reflectance in consideration of multiple reflections, as measured with the ultraviolet-visible-infrared spectrophotometer, and the unit of the reflectance is dimensionless.

T* represents the transmittance in consideration of multiple reflections, as measured with the ultraviolet-visible-infrared spectrophotometer, and the unit of the transmittance is dimensionless.

α represents the coefficient of light absorption, and the unit of the coefficient of light absorption is $cm^{-1}$.

R represents the reflectance in one reflection of the near-infrared light in the semi-insulating GaAs single-crystal substrate, and the unit of the reflectance in one reflection is dimensionless.

d represents the thickness of the semi-insulating GaAs single-crystal substrate, and the unit of the thickness is cm.

Hereinafter, a procedure for determining the coefficient of light absorption is specifically described with reference to FIG. 1. First, for example, one semi-insulating GaAs single-crystal substrate 1 serving as a measurement object is obtained by applying a conventionally known processing method to a semi-insulating GaAs single crystal obtained based on a manufacturing method described below. A rectangular section 11*a* (for example, thickness 600 μm) of a size of 20 mm in length×20 mm in width, with the center (for example, the center of a first main surface 11) as a center O, is produced from this one semi-insulating GaAs single-crystal substrate 1, and therefore a measurement sample of the coefficient of light absorption is obtained. Next, near-infrared light at a wavelength of 940 nm is incident at an angle of 85 degrees tilted by 5 degrees from perpendicular incidence to the main surface, to the center of rectangular section 11*a*, with an ultraviolet-visible-infrared spectrophotometer (trade name (item number): "U-4000", manufactured by Hitachi High-Tech Corporation) and an absolute reflectance measurement unit attached therewith. Thus, the transmittance and the reflectance of the near-infrared light, of semi-insulating GaAs single-crystal substrate 1, are measured. The transmittance and the reflectance are obtained as measurement values through multiple reflections between parallel two main surfaces (namely, front and rear surfaces) of semi-insulating GaAs single-crystal substrate 1. Finally, the coefficient of light absorption can be determined by assigning the transmittance and the reflectance, and the thickness of the rectangular section to expression 1, expression 2 and expression 3 in consideration of multiple reflections, and performing repeated numerical calculation. Here, the coefficient of light absorption is determined together with the reflectance in one reflection in first main surface 11 of semi-insulating GaAs single-crystal substrate 1. The "reflectance in one reflection" means a reflectance determined based on transmission and reflection of incident near-infrared light, initially occurring in first main surface 11 of semi-insulating GaAs single-crystal substrate 1. The coefficient of light absorption obtained based on the above rectangular section determined to serve as a measurement object is herein defined as the coefficient of light absorption of the semi-insulating GaAs single-crystal substrate with respect to near-infrared light at a wavelength of 940 nm. Here, expressions 1 and 2 in consideration of multiple reflections are those for determining the value of convergence of infinite geometric series under the assumption that infinite reflections are received.

(EPD)

The number of etch pits per square centimeter, formed on the first main surface, in an etching test with immersion of the semi-insulating GaAs single-crystal substrate in molten potassium hydroxide at 500° C. for 10 minutes is 300 or less. In other words, the etch pit density (EPD) of the first main surface of the semi-insulating GaAs single-crystal substrate is 300 $cm^{-2}$ or less. The EPD is preferably 260 $cm^{-2}$ or less, and more preferably 200 $cm^{-2}$ or less. Thus, the semi-insulating GaAs single-crystal substrate can include low dislocation ability. In a case where the EPD of the first main surface of the semi-insulating GaAs single-crystal substrate is more than 300 $cm^{-2}$, a defect based on dislocation in the semi-insulating GaAs single-crystal substrate is increased and thus the manufacturing yield in application to VCSEL has a risk of being adversely affected. A lower numerical value of the EPD is more desirable, and thus the lower limit value is not required to be limited, but the EPD is usually 0.5 $cm^{-2}$ or more.

Hereinafter, the method for measuring the EPD is described with reference to FIG. 2. First, for example, semi-insulating GaAs single-crystal substrate 1 as a measurement object is obtained based on a manufacturing method described below. Furthermore, a main surface (for example, first main surface 11) of semi-insulating GaAs single-crystal substrate 1 is mirror-polished and then immersed in a potassium hydroxide (KOH) melt at 500° C. for 10 minutes, to form a corroded pore called etch pit on first main surface 11. For the purpose of clarifying the etch pit, first main surface 11 mirror-polished can be subjected to at least one of pre-treatment with sulfuric acid and hydrogen peroxide or pre-treatment with an aqueous ammonia solution and hydrogen peroxide, before immersion in a potassium hydroxide (KOH) melt for 10 minutes. The etch pit, although does not have the same meaning as dislocation from 16 an academic viewpoint, can be viewed as an equivalent to dislocation in the art.

Next, a lattice 11*b* in which 5-mm squares are bedded so as not to be mutually overlapped, but to stand in line as much as possible, is formed on the entire surface of first main surface 11 of semi-insulating GaAs single-crystal substrate 1 taken out from the potassium hydroxide melt, and first main surface 11 is fractionated with this lattice 11*b*. For example, lattice 11*b* can be directly written on the substrate with a pen or the like and thus formed. Subsequently, each square constituting lattice 11*b* on first main surface 11 is defined as one field of view, and the number of etch pits present in the one field of view is counted with a known optical microscope (for example, trade name: "ECLIPSE (registered trademark) LV150N", manufactured by Nikon Corporation). Finally, the number of etch pits present in each field of view is converted into the number per square centimeter. Thus, the number of etch pits per square centimeter is obtained with respect to the number of squares constituting lattice 11*b*, and thus a value obtained by dividing the sum of these numbers of etch pits per square centimeter by the number of squares can be determined as the EPD of first main surface 11. In a case where an outer circumference of the first main surface and an outside thereof appear in the field of view as described above, the field of view is excluded from the object for calculation of the EPD. The reason for this is because a region near an outer circumference of semi-insulating GaAs single-crystal substrate 1 is a region that is largely varied in number of etch pits depending on every substrate and is not usually used as a material of an optical device.

(Specific Resistance)

In the present embodiment, the specific resistance of the semi-insulating GaAs single-crystal substrate, as measured at 25° C. in Hall measurement according to the Van der Pauw method, is $1.0\times10^{8}$ Ω·cm or more. Specifically, the specific resistance determined at 25° C. in Hall measurement according to the Van der Pauw method, with the center of the semi-insulating GaAs single-crystal substrate, as a measurement object, exhibits a value of $1.0\times10^{8}$ Ω·cm or more. The specific resistance is preferably $1.5\times10^{8}$ Ω·cm or more, and more preferably $2.0\times10^{8}$ Ω·cm or more. Thus, it is possible to include sufficient transmission ability with respect to near-infrared light. In a case where the specific resistance is less than $1.0\times10^{8}$ Ω·cm, the semi-insulating GaAs single-crystal substrate, in which the above coefficient of light absorption tends to be more than 1.5 $cm^{-1}$, thus has a risk of having a difficulty in having sufficient transmission ability with respect to near-infrared light. A larger numerical value of the specific resistance tends to more lead to an enhancement in transmission ability of the semi-insulating GaAs single-crystal substrate, and thus the upper limit value is not required to be limited, but the specific resistance is usually $3.0\times10^{8}$ Ω·cm or less.

Hereinafter, the procedure for determining the specific resistance is specifically described with reference to FIG. 1 and FIG. 3. First, as illustrated in FIG. 1, for example, one semi-insulating GaAs single-crystal substrate 1 serving as a measurement object is obtained by applying a conventionally known processing method to a semi-insulating GaAs single crystal obtained based on a manufacturing method described below. Rectangular section 11*a* (for example, thickness 600 μm) of a size of 4 mm in length×4 mm in width, with the center (for example, the center of first main surface 11) as center O, is produced from a central portion of this one semi-insulating GaAs single-crystal substrate 1. Subsequently, as illustrated in FIG. 3, an electrode 21 including an alloy containing gold, nickel and germanium is formed on each of four corners of rectangular section 11*a* (surface to be measured), and thus a sample for Hall measurement is obtained. The shape of electrode 21 is not limited to a rectangle illustrated, and may be a fan shape or may be a circular shape. Hall measurement according to the Van der Pauw method can be applied to rectangular section 11*a* including electrode 21 in an atmosphere at 25° C., to determine the specific resistance. The specific resistance obtained based on the above rectangular section determined to serve as a measurement object is herein defined as the specific resistance of the semi-insulating GaAs single-crystal substrate, as measured at 25° C. in Hall measurement according to the Van der Pauw method.

(Carrier Concentration and Electron Mobility)

In the present embodiment, the carrier concentration in the semi-insulating GaAs single-crystal substrate, as measured at 25° C. in Hall measurement according to the Van der Pauw method, is preferably $8.0\times10^{6}$ $cm^{-3}$ or less. The electron mobility of the semi-insulating GaAs single-crystal substrate, as measured at 25° C. in Hall measurement according to the Van der Pauw method, is preferably 4500 $cm^2/V·s$ or more. Thus, it is possible to include higher transmission ability with respect to near-infrared light. When the carrier concentration is $8.0\times10^6$ $cm^{-3}$ or less and the electron mobility is 4500 $cm^2/V·s$ or more, the above coefficient of light absorption of the semi-insulating GaAs single-crystal substrate extremely unlikely exceeds 1.5 $cm^{-1}$, and thus transmission ability with respect to near-infrared light can be enhanced.

The carrier concentration is more preferably $3.0\times10^6$ $cm^{-3}$ or more and $7.0\times10^6$ $cm^{-3}$ or less. The electron mobility is more preferably 5000 $cm^2/V·s$ or more and 8000 $cm^2/V·s$ or less. Both the carrier concentration and the electron mobility can be determined by the same method as the above method for measuring the specific resistance.

(Residual Strain)

The average value of the residual strain, as an absolute value of a difference between the strain along the radial direction of the first main surface and the strain along the tangential direction of the first main surface in the semi-insulating GaAs single-crystal substrate is preferably $5.0\times10^{-6}$ or less. Thus, a semi-insulating GaAs single-crystal substrate can be provided which is hardly cracked in a manufacturing process. The average value of the residual strain is more preferably $3.5\times10^{-6}$ or less, and still more preferably $1.0\times10^{-6}$ or less. The average value of the residual strain is preferably $5.0\times10^{6}$ or less because the semi-insulating GaAs single-crystal substrate is sufficiently suppressed in cracking thereof in a manufacturing process and does not have an adverse effect on the yield. The lower limit of the average value of the residual strain is not particularly limited, but the average value of the residual strain is actually $5.0\times10^{-7}$ or more. Herein, the strain along the radial direction of the first main surface may be represented by "Sr" and the strain along the tangential direction of the first main surface may be represented by "St".

The average value of the residual strain can have each more preferred value based on, for example, the difference in the diameter of the semi-insulating GaAs single-crystal substrate and the like. For example, in a case where the diameter of the substrate is 100 mm, the average value of the residual strain is more preferably $2.0\times10^{-6}$ or less, in a case where the diameter of the substrate is 150 mm, the average value of the residual strain is more preferably $3.5\times10^{-6}$ or less, and in a case where the diameter of the substrate is 200 mm, the average value of the residual strain is more preferably $5.0\times10^{-6}$ or less. The semi-insulating GaAs single-crystal substrate can also have a more preferred average value of the residual strain depending on the type of an atom contained as an impurity.

The residual strain (hereinafter, also designated as "|Sr−St|"), as an absolute value of the difference between the strain along the radial direction of the first main surface and the strain along the tangential direction of the first main surface can be measured based on a photoelasticity method described in "Review of Scientific Instruments Vol. 64 No. 7 p 1815-1821 (1993)". First, the semi-insulating GaAs single-crystal substrate (for example, thickness 700 μm) is subjected to mirror polishing of the first main surface thereof and a second main surface opposite to the first main surface, as in the above method for measuring the EPD, and thus the first main surface and the second main surface are each adopted as a polished surface having an arithmetic average roughness Ra of 0.1 nm or more and 0.5 nm or less. Next, the photoelasticity method, in which light is transmitted from one main surface to an opposite main surface, can be applied to measure the residual strain with the entire surface of the substrate, as an object. In particular, the residual strain can be determined as the absolute value |Sr−St|, in the photoelasticity method. The residual strain (|Sr−St|) is defined as in the following expression (1) in the photoelasticity method.

[Expression 1]

$$|S_r - S_t| = k\delta\left[\left(\frac{\cos 2\varphi}{P_{11} - P_{12}}\right)^2\left(\frac{\sin 2\varphi}{P_{44}}\right)^2\right]^{1/2} \quad (1)$$

In expression (1), $k=(\lambda/\pi d n_0^3)$.

In expression (1), λ represents the wavelength (μm) of light used in measurement, d represents the thickness (μm) of the semi-insulating GaAs single-crystal substrate used in measurement, no represents the refractive index of a crystal with no strain, δ represents the phase difference occurring due to birefringence of a specimen to be measured, o represents the azimuth of principal vibration, and $P_{11}$, $P_{12}$, and $P_{44}$ each represent a photoelastic constant.

According to the photoelasticity method, the residual strain (|Sr−St|) on the first main surface of the semi-insulating GaAs single-crystal substrate can be determined by measurement of only the phase difference 8 and the azimuth of principal vibration o occurring due to birefringence of sample to be measured. The average value of the residual strain (Sr−St) can be determined by the following method, for example, in a case where the first main surface of the semi-insulating GaAs single-crystal substrate (thickness 675 μm) is the (100) plane of a GaAs single crystal. First, a semiconductor laser at a wavelength of 1300 nm is used as a light source. Furthermore, the semiconductor laser is incident perpendicular to the first main surface to scan the entire surface as an object at a pitch of 0.5 mm in each of the <011> direction and the <01-1> direction perpendicular to each other, thereby measuring the phase difference δ and the azimuth of principal vibration φ. The spot size of the semiconductor laser is here set to a diameter of 0.5 mm or less. Thus, the residual strain in a region sectioned to a size of 0.5 mm×0.5 mm per measurement point can be determined by the above photoelasticity method. Finally, the sum of the resulting residual strain measurement values can be divided by the total number of measurement regions, to determine the average value of the residual strain (|Sr−St|). Here, any outer circumference portion of the substrate and the like, which is subjected to grinding and processing, and the like, thereby not allowing the semiconductor laser to be incident perpendicular to the first main surface, is excluded from the measurement object for determination of the average value of the residual strain (|Sr−St|). Also in a case where an off-angle is provided on the first main surface, the phase difference δ and the azimuth of principal vibration o are measured by allowing the semiconductor laser to be incident perpendicular to the first main surface and scanned in a direction in which each vector perpendicular to the (011) plane and the (01-1) plane of a GaAs single crystal is projected to the first main surface.

Figure 4:
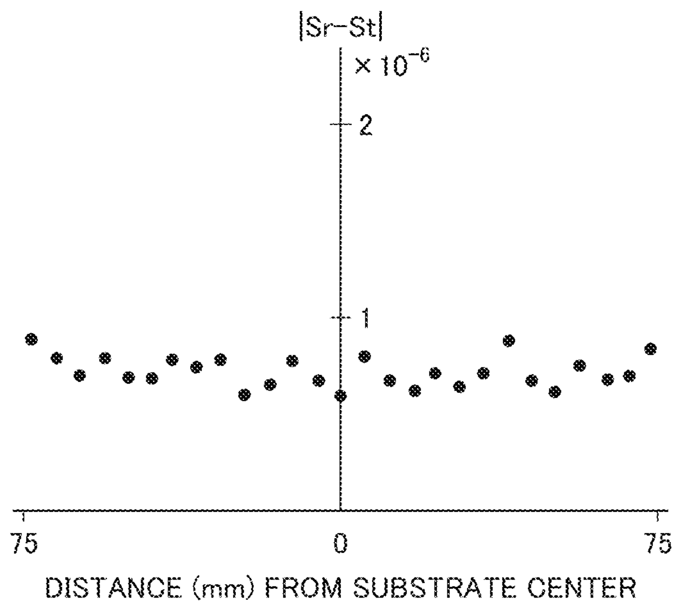
FIG. 4 is a graph that describes a residual strain distribution on a first main surface of a semi-insulating gallium arsenide single-crystal substrate according to the present embodiment.

A distribution of the residual strain (|Sr−St|) on the first main surface can be represented by, for example, a graph of FIG. 4. FIG. 4 is a graph that describes a residual strain distribution on a first main surface of a semi-insulating gallium arsenide single-crystal substrate according to the present embodiment. In FIG. 4, the vertical axis represents the amount of the residual strain and the horizontal axis represents the distance from the substrate center. For example, according to the semi-insulating GaAs single-crystal substrate illustrated in FIG. 4, the average value of the residual strain is about $0.8\times10^{-6}$ and there is no large difference between the amount of the residual strain on an outer circumference of the substrate and the amount of the residual strain around the substrate center, and it is understood that the residual strain is suppressed at the same level over the entire region of the substrate.

(EL2 Concentration)

The EL2 concentration of the semi-insulating GaAs single-crystal substrate is preferably $7.5\times10^{15}$ $cm^{-3}$ or more and $1.0\times10^{16}$ $cm^{-3}$ or less. Specifically, the EL2 concentration determined with the center of the semi-insulating GaAs single-crystal substrate as a measurement object preferably represents a value of $7.5\times10^{15}$ $cm^{-3}$ or more and $1.0\times10^{16}$ $cm^{-3}$ or less. Thus, the carrier concentration of the semi-insulating GaAs single-crystal substrate can be sufficiently low, and therefore it is possible to include higher transmission ability with respect to near-infrared light. The EL2 concentration is more preferably $7.5\times10^{15}$ $cm^{-3}$ or more and $9.5\times10^{15}$ $cm^{-3}$ or less. If the EL2 concentration is $1.0\times10^{16}$ $cm^{-3}$ or less, the possibility where the above coefficient of light absorption of the semi-insulating GaAs single-crystal substrate exceeds 1.5 $cm^{-1}$ is extremely low, and thus it is easy to include sufficient transmission ability with respect to near-infrared light. A lower numerical value of the EL2 concentration tends to more lead to an enhancement in transmission ability of the semi-insulating GaAs single-crystal substrate, and thus the lower limit is not required to be limited, but the EL2 concentration is preferably $7.5\times10^{15}$ $cm^{-3}$ or more in consideration of the possibility having an adverse effect on other characteristics, and the like.

The EL2 concentration can be determined by the following method. In other words, the EL2 concentration can be determined by a known calculation method, based on the value of the coefficient of light absorption after determination of the coefficient of light absorption in the same manner as in the above method for determining the coefficient of light absorption except that near-infrared light at a wavelength of 1100 nm is incident at an angle of 85 degrees to the center of the rectangular section with an ultraviolet-visible-infrared spectrophotometer (trade name (item number): “V-570”, manufactured by JASCO Corporation). A specific calculation method can be found in, for example, FIG. 3 of “Applied Physics Letters Vol 39 p 747, (1981)”. The EL2 concentration obtained based on the above rectangular section determined to serve as a measurement object is herein defined as the EL2 concentration of the semi-insulating GaAs single-crystal substrate.

(Average Atomic Concentration of Carbon)

The semi-insulating GaAs single-crystal substrate preferably includes carbon. In this case, the average atomic concentration of the carbon in the semi-insulating GaAs single-crystal substrate is preferably $5.0\times10^{15}$ $cm^{-3}$ or more and $1.2\times10^{16}$ $cm^{-3}$ or less. Specifically, the average atomic concentration of the carbon, determined with the center of the semi-insulating GaAs single-crystal substrate, as a measurement object, preferably exhibits a value of $5.0\times10^{15}$ $cm^{-3}$ or more and $1.2\times10^{16}$ $cm^{-3}$ or less. Thus, the above EL2 concentration compensates for the carbon atom as an acceptor, and thus the semi-insulating GaAs single-crystal substrate can be higher in resistance and therefore can include higher transmission ability with respect to near-infrared light. The average atomic concentration of the carbon is more preferably $6.0\times10^{15}$ $cm^{-3}$ or more and $1.0\times10^{16}$ $cm^{-3}$ or less, and further preferably $7.0\times10^{15}$ $cm^{-3}$ or more and $9.0\times10^{15}$ $cm^{-3}$ or less. When the average atomic concentration of the carbon is $5.0\times10^{15}$ $cm^{-3}$ or more, the possibility where the above coefficient of light absorption of the semi-insulating GaAs single-crystal substrate exceeds 1.5 $cm^{-1}$ is extremely low, and thus it is easy to include sufficient transmission ability with respect to near-infrared light. A higher numerical value of the average atomic concentration of the carbon tends to more lead to an enhancement in transmission ability of the semi-insulating GaAs single-crystal substrate, and thus the upper limit value is not required to be limited, but the average atomic concentration of the carbon is preferably $1.2\times10^{16}$ $cm^{-3}$ or less in consideration of the possibility having an adverse effect on other characteristics, and the like.

The average atomic concentration of the carbon can be determined by the following method. First, for example, one semi-insulating GaAs single-crystal substrate serving as a measurement object is obtained by applying a conventionally known processing method to a semi-insulating GaAs single crystal obtained based on a manufacturing method described below. A strip section (for example, thickness 675 μm) of a size of 10 mm in length×1 mm in width, including the center (for example, center of the first main surface) of this one semi-insulating GaAs single-crystal substrate, is produced from the substrate, to obtain a measurement sample of the atomic concentration of carbon. Next, the intensity of transmitted light I around 579.7 $cm^{-1}$ of the measurement sample is measured with a Fourier transform infrared spectrophotometer (trade name (item number): “TENSOR II FTIR Spectrometer”, manufactured by Bruker). Thus, the absorbance $A=\mathrm{Log}(I_0/I)$ as a logarithmic display of the ratio with the intensity of incident light $I_0$ is calculated. In this regard, a control sample in which the average atomic concentration (hereinafter, also designated as “C concentration”) of carbon is identified in advance is subjected to the measurement with the Fourier transform infrared spectrophotometer, and thus a calibration curve is created. Finally, the C concentration of the measurement sample can be determined from the absorbance A, with reference to the calibration curve. Since absorption around 579.7 $cm^{-1}$ is attributable to lattice vibration of carbon (C) with which an As site is substituted, with respect to the Fourier transform infrared spectrophotometer, the value of the absorbance A is calculated as a value proportional to the C concentration. The atomic concentration of carbon, obtained based on the above strip section set as a measurement object, is herein defined as the average atomic concentration of carbon in the semi-insulating GaAs single-crystal substrate. In a case where the C concentration is so low that the absorbance is lower, the C concentration can also be determined from a calibration curve that is according to a much thicker measurement sample produced.

(Arithmetic Average Roughness Ra)

The arithmetic average roughness Ra of the first main surface in the semi-insulating GaAs single-crystal substrate is preferably 1 nm or less. In other words, the surface roughness of the first main surface preferably exhibits a value of 1 nm or less in terms of arithmetic average roughness Ra prescribed in JIS B 0601-2001. Thus, specularity of the first main surface can be enhanced, and thus application to an optical device such as a VCSEL is more advantageous. The arithmetic average roughness Ra of the first main surface of the semi-insulating GaAs single-crystal substrate is more preferably 0.5 nm or less, and still more preferably 0.3 nm or less. Furthermore, a smaller numerical value of the arithmetic average roughness Ra is more advantageous, and thus the lower limit value is not required to be limited, but the arithmetic average roughness Ra is actually 0.05 nm or more.

The arithmetic average roughness Ra of the first main surface can be measured in an intermittent contact mode with an atomic force microscope (for example, trade name: "Dimension Edge", manufactured by Bruker).

<Impurity (Dopant)>

An impurity atom may be added into the semi-insulating GaAs single-crystal substrate in order to adjust characteristics such as semi-insulation, as long as the effects of the present disclosure are not adversely affected. Examples of a donor dopant to be added for adjustment of semi-insulating properties can include Si (silicon) atom and Te (tellurium) atom, and can include, in addition to C (carbon) described above as an acceptor dopant, a Zn (zinc) atom.

<Off-Angle>

The first main surface of the semi-insulating GaAs single-crystal substrate is preferably the {100} just plane having no off-angle or a plane having an off-angle of more than 0° and 3° or less from the {100} plane, of a semi-insulating GaAs single crystal. In a case where the first main surface has an off-angle of more than 0° and 3° or less from the {100} plane of a semi-insulating GaAs single crystal, for example, infrared emission at, for example, 940 nm can be achieved from a strain quantum well layer of a substrate with an epitaxial layer in which an $In_xGa_{1-x}As$ layer ($0 \leq x < 1$) as an infrared emission layer is placed on the first main surface.

A semi-insulating GaAs single-crystal substrate in which the first main surface is the {100} just plane of a semi-insulating GaAs single crystal can be obtained by slicing the {100} plane just plane having no off-angle as the first main surface, from a semi-insulating GaAs single crystal serving as a raw material. Alternatively, a semi-insulating GaAs single-crystal substrate in which the first main surface is the plane having an off-angle of more than 0° and 3° or less from the {100} plane of a semi-insulating GaAs single crystal can be obtained by carrying out a conventionally known inclined slicing method on a semi-insulating GaAs single crystal serving as a raw material so that the plane having an off-angle of more than 0° and 3° or less from the {100} plane serves as the first main surface. In a case where such a raw material is obtained, a growth direction of the semi-insulating GaAs single crystal is preferably the <100> direction. In the present disclosure, the "off-angle" has a precision error of #0.5°. For example, in a case where the first main surface is the {100} just plane, the first main surface can have an off-angle of-0.5 to 0.5° from the {100} plane. For example, in a case where the first main surface is the plane having an off-angle of 3° from the {100} plane, the first main surface can have an off-angle of 2.5 to 3.5° from the {100} plane.

The off-angle from the {100} plane in the first main surface of the semi-insulating GaAs single-crystal substrate can be measured by use of a conventionally known crystal orientation measurement apparatus (for example, trade name (item number): "2991G2", manufactured by Rigaku Corporation).

<Application>

A semi-insulating GaAs single-crystal substrate according to the present embodiment is preferably used in a vertical cavity surface emitting laser (VCSEL). Thus, characteristics included in the semi-insulating GaAs single-crystal substrate, including high transmission ability with respect to near-infrared light and low dislocation ability, can be utilized in a VCSEL, and therefore, a VCSEL significantly enhanced in manufacturing yield can be provided.

[Substrate with Epitaxial Layer]

A substrate with an epitaxial layer according to the present embodiment includes the semi-insulating GaAs single-crystal substrate, and an epitaxial layer placed on the first main surface. The epitaxial layer includes an infrared emission layer. The substrate with an epitaxial layer, having such features, can provide a substrate with an epitaxial layer suitable for an optical device such as a VCSEL, by both characteristics of high transmission ability with respect to near-infrared light and low dislocation ability included in the semi-insulating GaAs single-crystal substrate.

<Epitaxial Layer>

(Infrared Emission Layer)

The substrate with an epitaxial layer includes an epitaxial layer placed on the first main surface of the semi-insulating GaAs single-crystal substrate, as described above. The epitaxial layer includes an infrared emission layer. In this case, the infrared emission layer may be directly placed on the first main surface, or may be placed on the first main surface with, for example, an n-type or p-type clad layer or DBR (Distributed Bragg Reflector) layer being interposed.

The infrared emission layer may be a compound layer formed by epitaxial growth on the first main surface of the semi-insulating GaAs single-crystal substrate or the DBR layer. The composition of the compound layer is not required to be particularly limited as long as, for example, epitaxial growth can be made on the first main surface or the DBR layer, and a layer including a compound semiconductor single crystal is preferred from the viewpoint of growth of a high-quality compound layer. Examples of the layer including a compound semiconductor single crystal can include a composition including a Group 13 element such as Al (aluminum), Ga (gallium), or In (indium), and a Group 15 element such as N (nitrogen), P (phosphorus), or As (arsenicum). Specific example includes an $In_xGa_{1-x}As$ layer ($0 \leq x < 1$), an $In_xGa_{1-x}As_yP_{1-y}$ layer ($0 \leq x < 1$, $0 < y \leq 1$), a GaAs layer, $Al_xGa_{1-x}As$ layer ($0 \leq x < 1$), an $Al_xGa_yIn_{1-x-y}P$ layer ($0 < x$, $0 < y$, $x+y < 1$), and an Al, $Ga_yIn_{1-x-y}As$ layer ($0 < x$, $0 < y < 1$, $x+y \leq 1$)

The infrared emission layer is, in particular, preferably an $In_xGa_{1-x}As$ layer ($0 \leq x < 1$) or an $Al_xGa_{1-x}As$ layer ($0 \leq x < 1$). It is thus possible to provide a substrate with an epitaxial layer that has an emission wavelength around a wavelength of 900 nm and that is suitable for an optical device such as a VCSEL.

Figure 5:
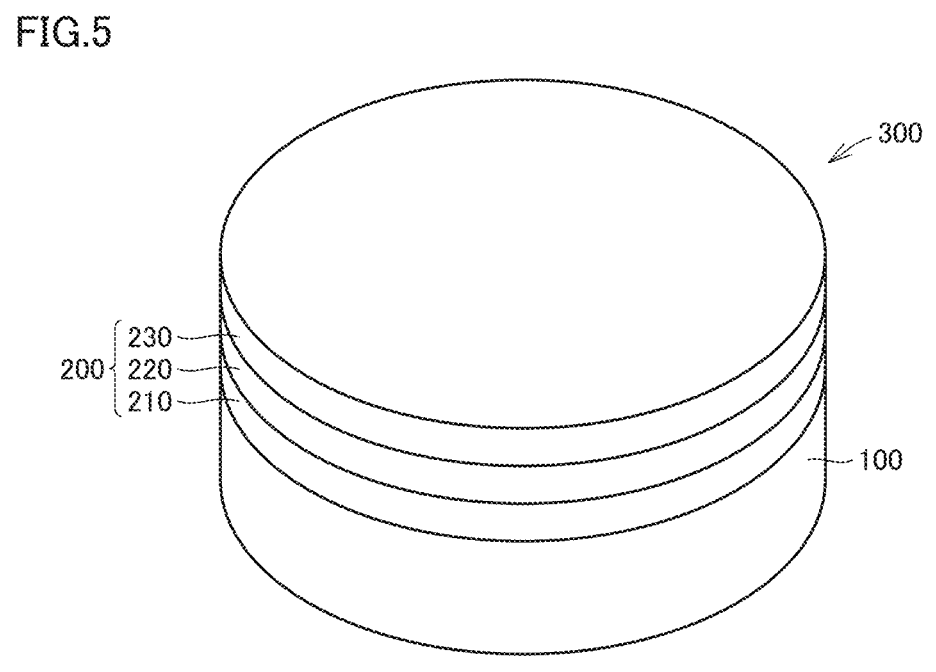

Hereinafter, an outline of the structure of the substrate with an epitaxial layer is simply described with reference to FIG. 5. FIG. 5 is an illustrative diagram that describes a substrate with an epitaxial layer according to the present embodiment. A substrate 300 with an epitaxial layer according to the present embodiment includes semi-insulating GaAs single-crystal substrate 100, and an epitaxial layer 200 formed by epitaxial growth on a first main surface of semi-insulating GaAs single-crystal substrate 100. Epitaxial layer 200 includes a first DBR layer 210, an infrared emission layer 220 and a second DBR layer 230 in the listed order, closer to semi-insulating GaAs single-crystal substrate 100. First DBR layer 210 may be a P-type DBR layer and second DBR layer 230 may be an N-type DBR layer. Epitaxial layer 200, although illustration thereof is omitted, can further include a current constriction layer at least any of between first DBR layer 210 and infrared emission layer 220, between second DBR layer 230 and infrared emission layer 220, and between an interior of first DBR layer 210 and an interior of second DBR layer 230. The current constriction layer can exert a lens effect by efficient current injection into an active region. Any other layer such as a spacer layer and/or a contact layer can also be included between first DBR layer 210 and infrared emission layer 220, and between second DBR layer 230 and infrared emission layer 220.

Substrate 300 with an epitaxial layer having the above structure is suitable for an optical device such as a VCSEL, by both characteristics of high transmission ability with respect to near-infrared light and low dislocation ability included in semi-insulating GaAs single-crystal substrate 100. For example, a VCSEL can be formed on substrate 300 with an epitaxial layer, by not only forming a P-type semiconductor contact layer and an anode electrode on semi-insulating GaAs single-crystal substrate 100, but also forming an N-type semiconductor contact layer and a cathode electrode on second DBR layer 230.

[Method for Manufacturing Semi-Insulating Gallium Arsenide Single Crystal]

A method for manufacturing a semi-insulating gallium arsenide single crystal (semi-insulating GaAs single crystal) is not required to be particularly limited as long as it is a method capable of manufacturing a semi-insulating GaAs single crystal allowing a semi-insulating GaAs single-crystal substrate having each characteristic of the coefficient of light absorption with respect to near-infrared light at a wavelength of 940 nm, the EPD, the specific resistance, and the like, as described above, to be obtained. However, a semi-insulating GaAs single crystal is preferably obtained by, for example, the following manufacturing method, from the viewpoint that the semi-insulating GaAs single-crystal substrate having such each characteristic is obtained at a favorable processing yield.

In other words, a method for manufacturing a semi-insulating GaAs single crystal according to the present embodiment is a method for manufacturing a semi-insulating GaAs single crystal with a vertical boat method. The method for manufacturing a semi-insulating GaAs single crystal includes a step of preparing a single crystal growth apparatus including at least a cylindrical crucible and a heating element that heats the crucible (first step), a step of receiving a seed crystal at a bottom portion of the crucible and receiving gallium arsenide (GaAs) bulk at an upper portion as compared with the seed crystal in the crucible (second step, hereinafter, also designated as "raw material-loading step"), a step of heating the crucible by the heating element to partially melt the GaAs and the seed crystal, thereby not only obtaining a GaAs melt, but also contacting the GaAs melt and a residue of the seed crystal (third step, hereinafter, also designated as "raw material-melting step"), and a step of growing a crystal on the seed crystal in the GaAs melt to obtain a semi-insulating GaAs single crystal (fourth step). The step of obtaining a semi-insulating GaAs single crystal is carried out with a relationship among the following formula 4, formula 5 and formula 6 being satisfied.

$$0.20^\circ\ \text{C./mm} \le X \le 0.30^\circ\ \text{C./mm} \quad \text{Formula 4}$$

$$X + 0.0012^\circ\ \text{C./mm}^2 \times Y \le Z1 \le X + 0.0024^\circ\ \text{C.}/\text{mm}^2 \times Y \quad \text{Formula 5}$$

$$0.26^\circ\ \text{C./mm} \le Z2 \le 0.42^\circ\ \text{C./mm} \quad \text{Formula 6}$$

In the formula 4, formula 5 and formula 6,

X represents a temperature gradient along the axial direction of the crucible, as measured with, as the center, an interface between the crystal and the gallium arsenide melt, and the unit of the temperature gradient is ° C./mm.

Y represents a distance from the interface to a first reference point in the crystal, and the unit of the distance is mm.

Z1 represents a temperature gradient along the axial direction of the crucible, as measured with the first reference point as the center, and the unit of the temperature gradient is ° C./mm.

Z2 represents a temperature gradient along the axial direction of the crucible, as measured with, as the center, the first reference point at a distance from the interface to the first reference point, of 50 mm, and the unit of the temperature gradient is ° C./mm.

According to the manufacturing method having such features, it is possible to obtain a semi-insulating GaAs single crystal including both characteristics of high transmission ability with respect to near-infrared light and low dislocation ability. Furthermore, the semi-insulating GaAs single crystal can be used to obtain a semi-insulating gallium arsenide single-crystal substrate that carries both characteristics of high transmission ability with respect to near-infrared light and low dislocation ability and therefore is suitable for an optical device such as a VCSEL.

The present inventors have conceived growth of a semi-insulating GaAs single crystal with suppression of the occurrence of dislocation as much as possible, by critically controlling the growth temperature of a semi-insulating GaAs single crystal under specific conditions in the course of manufacturing the semi-insulating GaAs single crystal with a vertical boat method. In particular, not only the temperature of an interface between a solidified semi-insulating GaAs single crystal by growth and a gallium arsenide melt in contact with the semi-insulating GaAs single crystal, but also the temperature in the solidified semi-insulating GaAs single crystal, is critically controlled so that a step of obtaining the semi-insulating GaAs single crystal with a temperature gradient derived from formula 4, formula 5 and formula 6 described above being satisfied is carried out. The inventors have thus found that a semi-insulating GaAs single crystal with low dislocation is obtained regardless of a low carrier concentration. The inventors have also conceived a semi-insulating GaAs single-crystal substrate including both characteristics of high transmission ability with respect to near-infrared light and low dislocation ability, by use of the semi-insulating GaAs single crystal.

The "processing yield" herein refers to a proportion at which a favorable semi-insulating GaAs single-crystal substrate is obtained in a serial process of manufacturing a semi-insulating GaAs single crystal and a substrate thereof. The "favorable" refers to no occurrence of any cracking, lacking, or the like in a semi-insulating GaAs single-crystal substrate precursor, a semi-insulating GaAs single-crystal substrate, and the like in a serial process involving growing a semi-insulating GaAs single crystal and slicing the crystal to a desired thickness to obtain a semi-insulating GaAs single-crystal substrate precursor and furthermore grinding and processing an outer circumference of the GaAs single-crystal substrate precursor to obtain a semi-insulating GaAs single-crystal substrate. Hereinafter, a method for manufacturing a semi-insulating GaAs single crystal according to the present embodiment, and a method for manufacturing a semi-insulating GaAs single-crystal substrate including the single crystal are specifically described with reference to FIG. 6 to FIG. 8.

Figure 6:
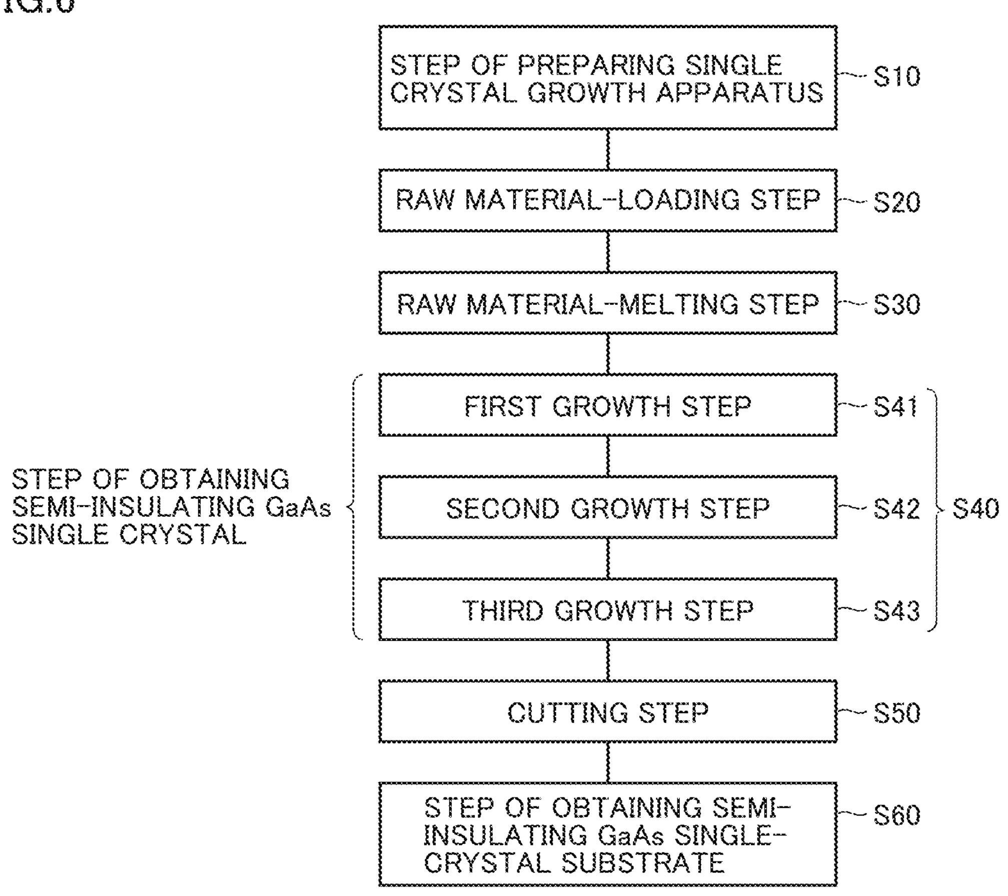
FIG. 6 is a flowchart illustrating an outline of a method for manufacturing a semi-insulating gallium arsenide single-crystal substrate according to the present embodiment.
Figure 7:
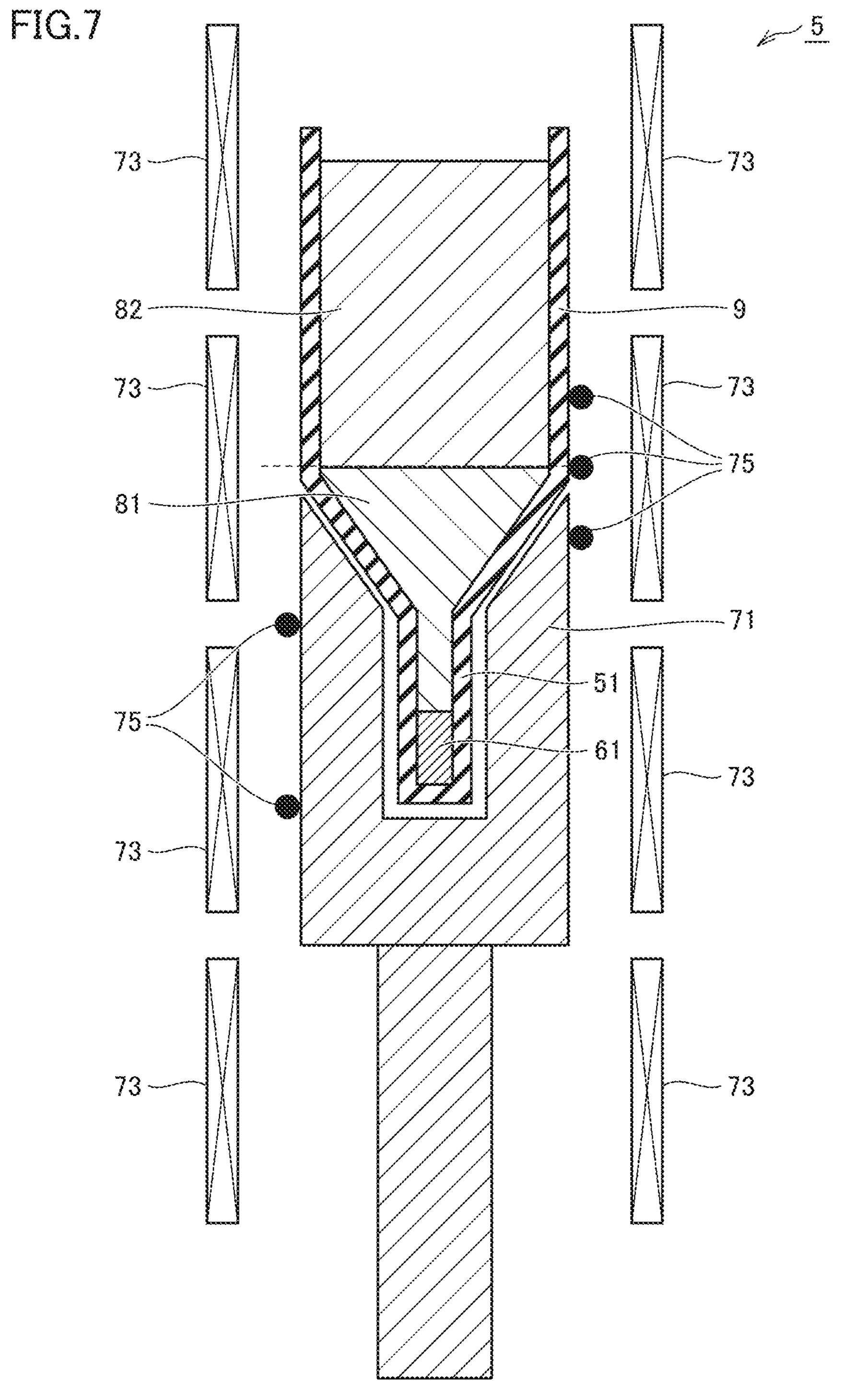
FIG. 7 is an illustrative diagram that relates to a method for manufacturing a semi-insulating gallium arsenide single crystal according to the present embodiment and that describes a step of obtaining a semi-insulating gallium arsenide single crystal with a single crystal manufacturing apparatus.
Figure 8:
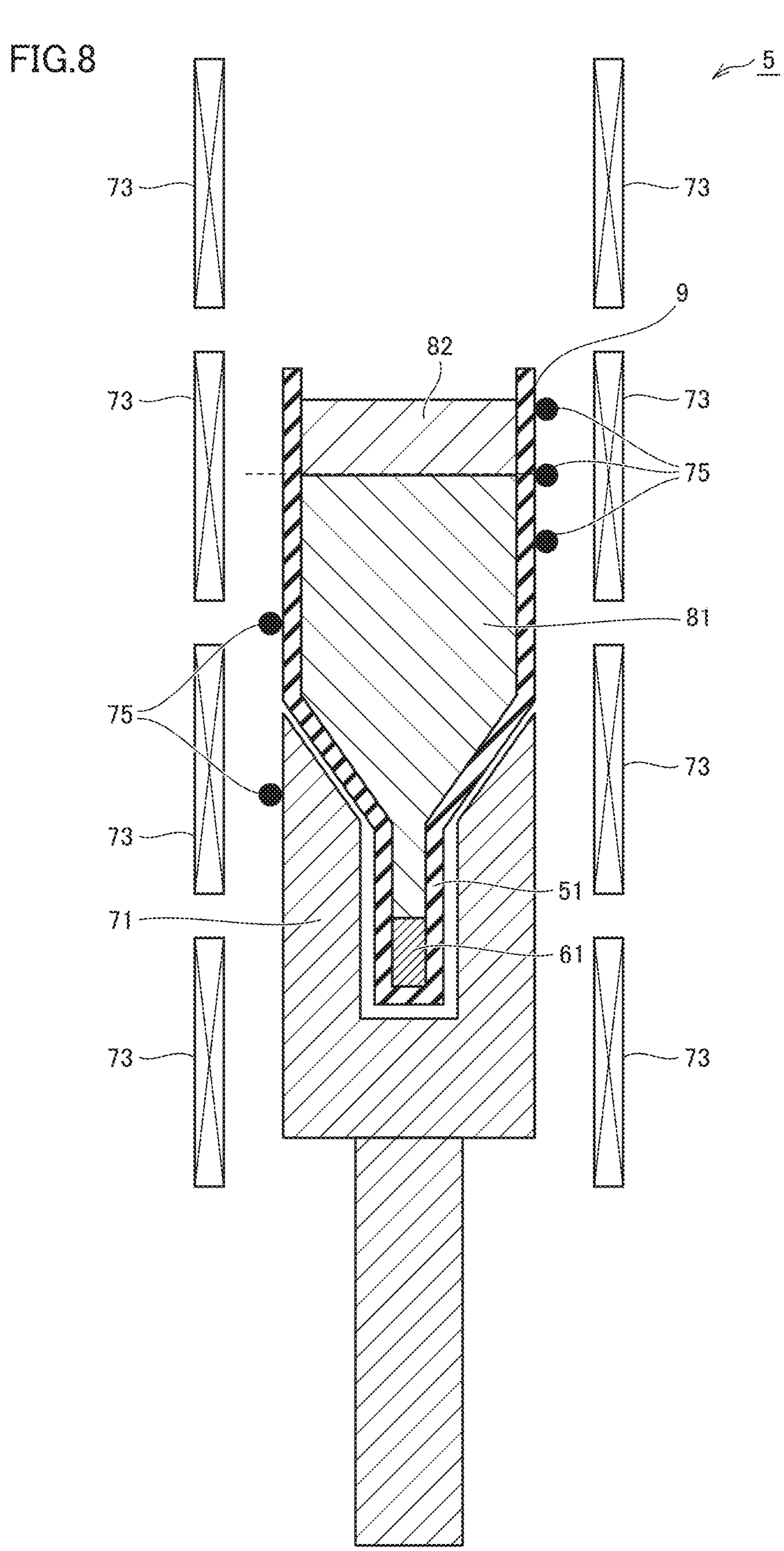
FIG. 8 is another illustrative diagram that relates to a method for manufacturing a semi-insulating gallium arsenide single crystal according to the present embodiment and that describes a step of obtaining a semi-insulating gallium arsenide single crystal with a single crystal manufacturing apparatus.

FIG. 6 is a flowchart illustrating an outline of a method for manufacturing a semi-insulating gallium arsenide single-crystal substrate according to the present embodiment. FIG. 7 is an illustrative diagram that relates to a method for manufacturing a semi-insulating gallium arsenide single crystal according to the present embodiment and that describes a step of obtaining a semi-insulating gallium arsenide single crystal with a single crystal manufacturing apparatus. FIG. 8 is another illustrative diagram that relates to a method for manufacturing a semi-insulating gallium arsenide single crystal according to the present embodiment and that describes a step of obtaining a semi-insulating gallium arsenide single crystal with a single crystal manufacturing apparatus.

The present embodiment is a method for manufacturing a semi-insulating GaAs single crystal with a vertical boat method. Examples of the vertical boat method can include a vertical Bridgman (VB) method, a vertical temperature gradient freezing (VGF) method, and a hybrid method in which a VB method and a VGF method are combined. Hereinafter, a method for manufacturing a semi-insulating GaAs single crystal with, for example, a VB method is described. In other words, the manufacturing method is a method for manufacturing a semi-insulating GaAs single crystal with a VB method, and can include, as illustrated in a flowchart in FIG. 5, step S10 (first step) of preparing a single crystal growth apparatus including at least a cylindrical crucible and a heating element that heats the crucible, step S20 (second step: raw material-loading step) of receiving a seed crystal at a bottom portion of the crucible and receiving GaAs bulk at an upper portion as compared with the seed crystal in the crucible, step S30 (third step: raw material-melting step) of heating the crucible by the heating element to partially melt the GaAs and the seed crystal, thereby not only obtaining a GaAs melt, but also contacting the GaAs melt and a residue of the seed crystal, and step S40 (fourth step) of growing a crystal on the seed crystal in the GaAs melt to obtain a semi-insulating GaAs single crystal. In particular, step S40 of obtaining a semi-insulating GaAs single crystal includes first growth step S41, second growth step S42 and third growth step S43 of growing a semi-insulating GaAs single crystal in the single crystal growth apparatus. These first growth step S41, second growth step S42 and third growth step S43 are described below.

Furthermore, in the manufacturing method, step S50 (fifth step, hereinafter, also designated as "cutting step") of cutting the semi-insulating GaAs single crystal obtained by the single crystal growth step into a disk shape, to take out the semi-insulating GaAs single crystal, and step S60 (sixth step) of grinding an outer circumference of the semi-insulating GaAs single crystal taken out in the cutting step and processing, such as polishing, a surface of the crystal to obtain a semi-insulating GaAs single-crystal substrate are preferably carried out in the listed order. Thus, a semi-insulating GaAs single-crystal substrate can be obtained from the semi-insulating GaAs single crystal at a favorable processing yield. Hereinafter, each step of the present manufacturing method is described in detail.

<First Step: Step of Preparing Single Crystal Growth Apparatus>

The first step is step S10 of preparing a single crystal growth apparatus including at least a cylindrical crucible and a heating element that heats the crucible. In the present step, for example, a single crystal growth apparatus 5 including a crucible 51 and a heating element 73, as illustrated in FIG. 7 to FIG. 8, is prepared. Thus, the above method for manufacturing a semi-insulating GaAs single crystal with a vertical boat method can be carried out.

Single crystal growth apparatus 5 illustrated in FIG. 7 includes cylindrical crucible 51 and a heating element 73 for heating crucible 51. Crucible 51 includes a seed crystal holding portion and a single crystal growth portion connected to the seed crystal holding portion. The seed crystal holding portion is a cylindrical region having a cylindrical cavity portion in which an opening is made at a side for connection to the single crystal growth portion and a bottom wall is formed at an opposite side to the side. The seed crystal holding portion can hold a gallium arsenide seed crystal (GaAs seed crystal) 61 in the cavity portion. The single crystal growth portion includes a conical portion and a straight body portion 9. The conical portion has a conical shape, and is connected to the seed crystal holding portion at the smaller diameter side in the axial direction. Straight body portion 9 has a hollow cylindrical shape and is connected at the larger diameter side of the conical portion in the axial direction. The single crystal growth portion has a function of holding a gallium arsenide raw material (GaAs raw material) in the bulk form therein. Furthermore, the single crystal growth portion has a function of freezing a GaAs raw material (hereinafter, also designated as "gallium arsenide melt 82 (GaAs melt 82)") that is heated and thus converted to a molten state to grow a semi-insulating GaAs single crystal 81. Here, crucible 51 can be constituted from various materials capable of being resistant to the temperature at which GaAs is molten. For example, pyrolytic boron nitride (PBN) is conveniently adopted as the material of crucible 51.

Furthermore, single crystal growth apparatus 5 includes a crucible holding stand 71 holding crucible 51, and a heating element 73 that is placed so as to surround an outside in the radial direction of crucible 51. The material of crucible holding stand 71, here adopted, can be, for example, quartz, alumina, or silicon carbide. Heating element 73 is placed so that two such elements surround an outside in the radial direction of crucible 51 in order to heat crucible 51. Heating element 73 here adopted can be, for example, a known electrical heater. The output of heating element 73 can be controlled independently with respect to one element. In particular, heating element 73 is divided to a plurality of parts with respect to one element in a perpendicular direction to the axis of crucible 51, to form multiple stages in some cases. In this case, the output of heating element 73 can be controlled independently with respect to one of parts formed as the multiple stages, and therefore the temperature of the content in crucible 51 can be adjusted along the axial direction of crucible 51.

Single crystal growth apparatus 5 preferably includes one or more thermocouples 75 on an outside in the radial direction of crucible 51, as illustrated in FIG. 7. In this case, the position(s) of thermocouple(s) 75 can be moved in a direction in parallel with the axial direction of crucible 51. Thermocouple(s) 75 here used can be, for example, known temperature monitor(s). Single crystal growth apparatus 5 includes such crucible 51, crucible holding stand 71, heating element 73 and thermocouple(s) 75, to control the temperature around an interface between GaAs seed crystal 61 and GaAs melt 82 in contact with GaAs seed crystal 61 or solidified semi-insulating GaAs single crystal 81, and the temperature in solidified semi-insulating GaAs single crystal 81 so that the temperatures correspond to a temperature gradient derived from formula 4, formula 5 and formula 6, in a single crystal growth step described below.

<Second Step: Raw Material-Loading Step>

The second step is step S20 of receiving a seed crystal at a bottom portion of the crucible and receiving GaAs bulk at an upper portion as compared with the seed crystal in the crucible. In the second step, specifically, materials (GaAs seed crystal 61 and GaAs raw material in the bulk form) required for growth of semi-insulating GaAs single crystal 81 in single crystal growth apparatus 5 are prepared, and these are placed at predetermined positions in single crystal growth apparatus 5. The second step can include the following seed crystal-loading step and GaAs polycrystal-loading step.

First, in the seed crystal-loading step, GaAs seed crystal 61 is loaded to the cavity portion of the seed crystal holding portion of crucible 51. A conventionally known method can be used as the method for loading GaAs seed crystal 61 to the seed crystal holding portion. Next, in the GaAs polycrystal-loading step, for example, a plurality of GaAs raw materials in the bulk form made of polycrystal GaAs is loaded and stacked on the conical portion and straight body portion 9 in the single crystal growth portion of crucible 51. Such GaAs raw materials here used can also be each a part inferior in physical properties of the GaAs single crystal, and the like. A conventionally known sealant (for example, sealant made of $B_2O_3$ (boron oxide)) is preferably placed on the GaAs raw materials.

<Third Step: Raw Material-Melting Step>

The third step is step S30 of heating the crucible by the heating element to partially melt the GaAs and the seed crystal, thereby not only obtaining a GaAs melt, but also contacting the GaAs melt and a residue of the seed crystal. In the third step, one portion of GaAs seed crystal 61, and the GaAs raw material in the bulk form are molten to contact GaAs seed crystal 61 and GaAs melt 82 at an interface therebetween, in order to manufacture semi-insulating GaAs single crystal 81. Specifically, first, crucible 51 in which GaAs seed crystal 61 and the GaAs raw material in the bulk form are placed is charged to crucible holding stand 71 in single crystal growth apparatus 5. Thereafter, current is fed to heating element 73, to heat crucible 51. When crucible 51 is heated, such heating is made by controlling heating element 73 so that the temperature of an interface with GaAs seed crystal 61 and the GaAs raw materials in the bulk form in the cavity portion of the seed crystal holding portion of crucible 51 exceeds the melting point of GaAs. Thus, the GaAs raw material in the bulk form is molten to provide GaAs melt 82. Furthermore, a GaAs raw material located at the interface with GaAs seed crystal 61 is also defined as GaAs melt 82, and one portion of GaAs seed crystal 61 (corresponding to about 50% by volume as compared with an interface of GaAs seed crystal 61 with GaAs melt 82) can also be molten.

<Fourth Step: Step of Semi-Insulating GaAs Single Crystal>

The fourth step is step S40 of growing a crystal on the seed crystal in the GaAs melt to obtain a semi-insulating GaAs single crystal. In the fourth step, first growth step S41, second growth step S42 and third growth step S43 as described below are carried out in the listed order in order to obtain a semi-insulating GaAs single crystal, thereby growing semi-insulating GaAs single crystal 81. In particular, the fourth step is carried out with a relationship among the following formula 4, formula 5 and formula 6 being satisfied.

$$0.20° \text{ C./mm} \leq X \leq 0.30° \text{ C./mm} \quad \text{Formula 4}$$

$$X + 0.0012° \text{ C./mm}^2 \times Y \leq Z1 \leq X + 0.0024° \text{ C./mm}^2 \times Y \quad \text{Formula 5}$$

$$0.26° \text{ C./mm} \leq Z2 \leq 0.42° \text{ C./mm} \quad \text{Formula 6}$$

In the formula 4, formula 5 and formula 6,

X represents a temperature gradient along the axial direction of the crucible, as measured with, as the center, an interface between the crystal and the gallium arsenide melt, and the unit of the temperature gradient is ° C./mm.

Y represents a distance from the interface to a first reference point in the crystal, and the unit of the distance is mm.

Z1 represents a temperature gradient along the axial direction of the crucible, as measured with the first reference point as the center, and the unit of the temperature gradient is ° C./mm.

Z2 represents a temperature gradient along the axial direction of the crucible, as measured with, as the center, the first reference point at a distance from the interface to the first reference point, of 50 mm, and the unit of the temperature gradient is ° C./mm.

Hereinafter, first growth step S41, second growth step S42 and third growth step S43 are specifically described.

(First Growth Step)

First growth step S41 is a step of solidifying and thus growing semi-insulating GaAs single crystal 81 from the molten one portion of GaAs seed crystal 61 and GaAs melt 82 in raw material-melting step S30. In first growth step S41, a predetermined temperature gradient along the axial direction of crucible 51 is formed with heating element 73, on an interface between GaAs seed crystal 61 and GaAs melt 82, and on an interface between solidified semi-insulating GaAs single crystal 81 and GaAs melt 82 with the respective interfaces as the centers so that the relationship of formula 4 is satisfied. Specifically, the output of heating element 73 is controlled so that the temperature at a position closer to GaAs seed crystal 61 and the temperature at a position closer to GaAs melt 82 in the axial direction of crucible 51 are respectively lower and higher and a temperature gradient X along the axial direction of crucible 51, with the interface between GaAs seed crystal 61 and GaAs melt 82 as the center, is 0.2 to 0.3° C./mm (0.20° C./mm≤X≤0.30° C./mm). In conjunction therewith, heating element 73 is moved along the axial direction of crucible 51 with temperature gradient X descried above being kept, and semi-insulating GaAs single crystal 81 is further solidified to grow an end portion (hereinafter, also designated as "growth end portion") of semi-insulating GaAs single crystal 81 upward in the axial direction of crucible 51 (vertical direction).

An interface between the growth end portion of semi-insulating GaAs single crystal 81 and GaAs melt 82 is also here moved upward in the axial direction of crucible 51 (vertical direction), and the output of heating element 73 is controlled so that the temperature of the interface also satisfies the relationship of formula 4 and temperature gradient X formed along the axial direction of crucible 51 with the interface as the center is kept. Furthermore, in first growth step S41, the output of heating element 73 is controlled so that the relationship of formula 5 is satisfied, thereby forming a predetermined temperature gradient Z1 ($X+0.0012°$ C./mm$^2$×Y≤Z1≤X+0.0024° C./mm$^2$×Y) along the axial direction of crucible 51 with, as the center, a first reference point described below in semi-insulating GaAs single crystal 81. The "first reference point" means a position away from the interface, by a distance (unit: mm) indicated by Y in formula 5, from the interface toward semi-insulating GaAs single crystal 81 along the axial direction of crucible 51 (vertical direction). The range of Y in formula 5 can be 0 to 100 mm. The rate of movement of heating element 73 along the axial direction of crucible 51 can be 0.3 mm/h or more and 5.0 mm/h or less. Here, crucible 51 itself can also be moved at the above rate along the axial direction, instead of heating element 73.

In first growth step S41, such an operation can be made to raise the growth end portion (interface between the growth end portion and GaAs melt 82) of semi-insulating GaAs single crystal 81, up to a connection portion between the conical portion and straight body portion 9 of the single crystal growth portion of crucible 51 (see FIG. 7).

(Second Growth Step)

Second growth step S42 is a step to be carried out subsequent to first growth step S41, and is a step of freezing GaAs melt 82 in straight body portion 9 in single crystal growth portion of crucible 51, to raise the growth end portion of semi-insulating GaAs single crystal 81 upward in the axial direction (vertical direction). Also in second growth step S42, the output of heating element 73 is controlled so that the temperature of the interface between the growth end portion of semi-insulating GaAs single crystal 81 and GaAs melt 82 satisfies the relationship of formula 4. Thus, temperature gradient X formed along the axial direction of crucible 51 with the interface as the center can be kept. The output of heating element 73 is controlled so that the relationship of formula 5 is satisfied, and thus predetermined temperature gradient Z1 along the axial direction of crucible 51 with, as the center, the first reference point in semi-insulating GaAs single crystal 81 is also kept. In particular, in second growth step S42, the output of heating element 73 is controlled so that a temperature gradient Z2 formed along the axial direction of crucible 51 with the first reference point as the center is 0.26 to 0.42° C./mm (0.26° C./mm≤Z2≤0.42° C./mm), in order that the relationship of formula 6 is satisfied in the case of a distance from the interface to the first reference point, of 50 mm (Y=50).

In second growth step S42, heating element 73 can be pulled upward in the axial direction (vertical direction), to further freeze GaAs melt 82 in straight body portion 9, thereby growing GaAs single crystal 81 upward in the axial direction (vertical direction). Second growth step S42 can raise the growth end portion (interface between the growth end portion and GaAs melt 82) of semi-insulating GaAs single crystal 81 up to an upper portion of straight body portion 9 in single crystal growth portion of crucible 51 (see FIG. 8). Also in second growth step S42, crucible 51 itself can also be moved at the above rate along the axial direction, instead of heating elements 73, as in first growth step S41.

In a case where the temperature gradient formed along the axial direction of crucible 51 with, as the center, an interface between semi-insulating GaAs single crystal 81 and GaAs melt 82 is less than 2° C./mm in first growth step S41 and second growth step S42, the EPD formed on the first main surface tends to easily exceed 300 $cm^{-2}$ in an etching test with immersion in molten potassium hydroxide at 500° C. for 10 minutes, performed with respect to the semi-insulating gallium arsenide single-crystal substrate obtained from the semi-insulating GaAs single crystal. Also in a case where formula 5 and formula 6 are not satisfied in first growth step S41 and second growth step S42, the EPD formed on the first main surface tends to easily exceed 300 $cm^{-2}$ in the etching test performed with respect to the semi-insulating gallium arsenide single-crystal substrate obtained from the semi-insulating GaAs single crystal.

Temperature gradients X, Z1 and Z2 described above can be determined based on measurement with thermocouple(s) 75.

(Third Growth Step)

Third growth step S43 is a step to be carried out subsequent to second growth step S42, and is a step of completing freezing of GaAs melt 82 remaining in straight body portion 9. Third growth step S43 is completed and thus the single crystal growth step is terminated. As described above, semi-insulating GaAs single crystal 81 is manufactured in crucible 51 and thereafter semi-insulating GaAs single crystal 81 is taken out from crucible 51.

<Method for Manufacturing Semi-Insulating Gallium Arsenide Single-Crystal Substrate>

The above method for manufacturing a semi-insulating GaAs single crystal is carried out to obtain a semi-insulating GaAs single crystal with low dislocation regardless of a low carrier concentration. Furthermore, a method for manufacturing a semi-insulating GaAs single crystal substrate according to the present embodiment is preferably performed by carrying out, in the listed order, step S50 (cutting step: fifth step) of cutting the semi-insulating GaAs single crystal into a disk shape, to take out the semi-insulating GaAs single crystal, and step S60 (sixth step) of grinding an outer circumference of the semi-insulating GaAs single crystal taken out in cutting step S50 and processing, such as polishing, a surface of the crystal to obtain a semi-insulating GaAs single-crystal substrate. Thus, a semi-insulating GaAs single-crystal substrate having a circular-shaped first main surface can be manufactured.

(Fifth Step and Sixth Step: Cutting Step and Step of Obtaining Semi-Insulating GaAs Single-Crystal Substrate)

The fifth step is step S50 of cut the semi-insulating GaAs single crystal into a disk shape and taking out it. Furthermore, the sixth step is step S60 of grinding an outer circumference of the semi-insulating GaAs single crystal taken out in cutting step S50 and processing, such as polishing, a surface of the crystal to obtain a semi-insulating GaAs single-crystal substrate having a circular-shaped first main surface. The cutting step and the step of obtaining a semi-insulating GaAs single-crystal substrate can be each carried out by use of a conventionally known cutting method, outer circumference grinding method, surface polishing method, or the like in such a method for manufacturing a GaAs single-crystal substrate with a VB method.

<Action>

As described above, a semi-insulating GaAs single-crystal substrate having a circular-shaped first main surface can be manufactured. The manufacturing method can allow a semi-insulating GaAs single crystal to be obtained with suppression of the occurrence of dislocation as much as possible, by critically controlling the temperature of growth of a semi-insulating GaAs single crystal under specific conditions. Thus, the manufacturing method can allow a semi-insulating GaAs single crystal with low dislocation to be obtained regardless of a low carrier concentration, and therefore can provide a semi-insulating GaAs single-crystal substrate suitable for an optical device demanded to have high transmission ability with respect to near-infrared light and low dislocation ability, such as a VCSEL. Moreover, a semi-insulating GaAs single-crystal substrate obtained by the above steps is favorable in processing yield.

EXAMPLES

Hereinafter, the present disclosure is more specifically described with respect to Examples, but the present disclosure is not limited thereto. In each Specimen described below, single crystal growth apparatus 5 as illustrated in FIG. 7 and FIG. 8 was used to grow a semi-insulating GaAs single crystal with the <100> direction as a growth direction, with a vertical boat method (for example, VB method). Furthermore, a semi-insulating GaAs single-crystal substrate in which the plane orientation of a first main surface was the {100} plane was obtained from the semi-insulating GaAs single crystal. In the following description, Specimen 1 to Specimen 4 correspond to Examples and Specimens 101 to Specimen 106 correspond to Comparative Examples.

Example 1

First, each semi-insulating GaAs single-crystal substrate of Specimen I to Specimen 4 and Specimens 101 to 106 was produced as follows.

<Specimen 1>

(First Step)

As described above, single crystal growth apparatus 5 including crucible 51 and heating element 73, illustrated in FIG. 7 and FIG. 8, was prepared. Here, the inner diameter of straight body portion 9 of crucible 51 used in production in Specimen 1 was 155 mm.

(Second Step)

GaAs seed crystal 61 and a GaAs raw material in the bulk form required for growth of semi-insulating GaAs single crystal 81 in single crystal growth apparatus 5 were prepared. GaAs seed crystal 61 was manufactured by a conventionally known method. Furthermore, a plurality of GaAs raw materials in the bulk form made of commercially available polycrystal GaAs was loaded and stacked on the conical portion and the straight body portion of crucible 51. Furthermore, a sealant made of $B_2O_3$ was placed on the GaAs raw materials in the bulk form.

(Third Step)

Crucible 51 in which GaAs seed crystal 61 and a GaAs raw material in the bulk form were placed was charged to crucible holding stand 71 of single crystal growth apparatus 5. Thereafter, current was fed to heating element 73, to perform heating so that the temperature of an interface between GaAs seed crystal 61 and the GaAs raw material in the bulk form in crucible 51 exceeded the melting point of GaAs. Thus, the GaAs raw material located at the interface with GaAs seed crystal 61 was defined as GaAs melt 82 and one portion of GaAs seed crystal 61 (corresponding to about 50% by volume as compared with a region in GaAs seed crystal 61, the region being close to GaAs melt 82) was also molten.

(Fourth Step)

—First Growth Step—

Heating element 73 for heating crucible 51 was controlled, to form a temperature gradient X at 0.26° C./mm along the axial direction of crucible 51 on an interface between semi-insulating GaAs seed crystal 61 and GaAs melt 82 and on an interface between solidified semi-insulating GaAs single crystal 81 and GaAs melt 82 with the respective interfaces as the centers so that the relationship of formula 4 was satisfied. Here, such control was made so that the temperature at a position closer to GaAs seed crystal 61 and the temperature at a position closer to GaAs melt 82 in the axial direction of crucible 51 were respectively lower and higher. Furthermore, such control was made so that temperature gradient Z1 along the axial direction of crucible 51, with a first reference point described below of semi-insulating GaAs single crystal 81 as the center, satisfied the relationship of formula 5 ($X+0.0012°\ C./mm^2 \times Y \le Z1 \le X+0.0024°\ C./mm^2 \times Y$). In conjunction therewith, heating element 73 was moved along the axial direction of crucible 51 with a temperature gradient X of 0.26° C./mm on the interface being kept, and semi-insulating GaAs single crystal 81 was further solidified to grow a growth end portion of semi-insulating GaAs single crystal 81 upward in the axial direction of crucible 51 (vertical direction), up to a connection portion between a conical portion and a straight body portion of crucible 51. The pull-up rate of heating element 73 in pulling up of heating element 73 was 2 mm/h. Here, for example, the temperatures of the interface between semi-insulating GaAs seed crystal 61 and GaAs melt 82, and the interface between solidified semi-insulating GaAs single crystal 81 and GaAs melt 82 were 1238° C.

—Second Growth Step—

Heating element 73 for heating crucible 51 was subsequently controlled to freeze GaAs melt 82 in the straight body portion of crucible 51, thereby raising the growth end portion of semi-insulating GaAs single crystal 81 upward in the axial direction of crucible 51 (vertical direction). The output of heating element 73 was here controlled so that the temperature of an interface between the growth end portion of semi-insulating GaAs single crystal 81 and GaAs melt 82 satisfied the relationship of formula 4 and temperature gradient X (0.26° C./mm) formed along the axial direction of crucible 51 with the interface as the center was kept. Furthermore, the output of heating element 73 was controlled so that the relationship of formula 6 was satisfied, and thus, when the first reference point of semi-insulating GaAs single crystal 81 was located at a position away from the interface toward semi-insulating GaAs single crystal 81, by 50 mm, a temperature gradient Z2 of 0.36° C./mm was formed with, as the center, a position away from the interface toward semi-insulating GaAs single crystal 81, by 50 mm.

The output of heating element 73 was controlled so that the relationship of formula 5 was satisfied, and thus, for example, when the first reference point of semi-insulating GaAs single crystal 81 was located at a position away from the interface toward semi-insulating GaAs single crystal 81, by 100 mm, a temperature gradient Z1 of 0.48° C./mm was formed along the axial direction of crucible 51 with, as the center, a position away from the interface toward semi-insulating GaAs single crystal 81, by 100 mm. Here, the temperature at a position away from the interface toward the semi-insulating GaAs single crystal 81, by 100 mm, was 1201° C.

—Third Growth Step—

GaAs melt 82 in the straight body portion of crucible 51 was subsequently frozen, to complete freezing of GaAs melt 82 remaining. Accordingly, semi-insulating GaAs single crystal 81 was manufactured in crucible 51. Thereafter, semi-insulating GaAs single crystal 81 was taken out from crucible 51, with a conventionally known method.

(Fifth Step and Sixth Step)

Conventionally known cutting method, outer circumference grinding method and surface polishing method were applied to semi-insulating GaAs single crystal 81 taken out from crucible 51. Thus, a first end surface (hereinafter, indicated by an abbreviation "F") and a second end surface (hereinafter, indicated by an abbreviation "B") of semi-insulating GaAs single crystal 81, the respective surfaces facing GaAs seed crystal 61 and an upper portion of crucible 51, were each cut at a thickness of 755 μm. Furthermore, outer circumferences of these were ground and surfaces of these were polished, to manufacture two semi-insulating GaAs single-crystal substrates each having circular two main surfaces (first main surface and second main surface). Accordingly, two semi-insulating GaAs single-crystal substrates each having a diameter (D) of 152.4 mm were obtained as Specimen 1.

<Specimen 2>

Two semi-insulating GaAs single-crystal substrates of Specimen 2 were obtained in the same manner as in Specimen I except that each of temperature gradients X, Z1 and Z2 in the first growth step and second growth step was changed as shown in Table 1 below.

<Specimen 3>

Two semi-insulating GaAs single-crystal substrates of Specimen 3 were obtained in the same manner as in Specimen 1 except that the inner diameter of crucible 51 was appropriately modified so that semi-insulating GaAs single-crystal substrates each having a diameter as shown in Table 1 below were obtained, and each of temperature gradients X, Z1 and Z2 in the first growth step and second growth step was changed as shown in Table 1 below.

<Specimen 4

Two semi-insulating GaAs single-crystal substrates of Specimen 4 were obtained in the same manner as in Specimen 1 except that the inner diameter of crucible 51 was appropriately modified so that semi-insulating GaAs single-crystal substrates each having a diameter as shown in Table 1 below were obtained, and each of temperature gradients X, Z1 and Z2 in the first growth step and second growth step was changed as shown in Table I below.

<Specimen 101>

Two semi-insulating GaAs single-crystal substrates of Specimen 101 were obtained by replication study of a method for manufacturing a semi-insulating GaAs single-crystal substrate according to Example II-1 disclosed in PTL 4. In this case, each of temperature gradients X, Z1 and Z2 in the first growth step and second growth step was as shown in Table 1 below.

<Specimen 102>

Two semi-insulating GaAs single-crystal substrates of Specimen 102 were obtained by replication study of a method for manufacturing a semi-insulating GaAs single-crystal substrate according to Example II-4 disclosed in PTL 4. In this case, each of temperature gradients X, Z1 and Z2 in the first growth step and second growth step was as shown in Table 1 below.

<Specimen 103>

Two semi-insulating GaAs single-crystal substrates of Specimen 103 were obtained by replication study of a method for manufacturing a semi-insulating GaAs single-crystal substrate according to Example 1 disclosed in Japanese Patent Laying-Open No. H11-335194. In this case, each of temperature gradients X, Z1 and Z2 in the first growth step and second growth step was as shown in Table 1 below.

<Specimen 104>

An ingot of Specimen 104 was obtained by replication study of a method for manufacturing an ingot disclosed in PTL 1, and two semi-insulating GaAs single-crystal substrates of Specimen 104 were obtained from the ingot. In this case, each of temperature gradients X, Z1 and Z2 in the first growth step and second growth step was as shown in Table 1 below.

<Specimen 105>

Two semi-insulating GaAs single-crystal substrates of Specimen 105 were obtained in the same manner as in Specimen 1 except that each of temperature gradients X, Z1 and Z2 in the first growth step and second growth step was changed as shown in Table 1 below.

<Specimen 106>

Two semi-insulating GaAs single-crystal substrates of Specimen 106 were obtained in the same manner as in Specimen 1 except that the inner diameter of crucible 51 was appropriately modified so that semi-insulating GaAs single-crystal substrates each having a diameter as shown in Table 1 below were obtained, and each of temperature gradients X, Z1 and Z2 in the first growth step and second growth step was changed as shown in Table 1 below.

<Evaluation of Characteristics>

Each of characteristics of the coefficient of light absorption with respect to near-infrared light at a wavelength of 940 nm, the EPD, the specific resistance, the carrier concentration, the electron mobility, the residual strain, the EL2 concentration and the average atomic concentration of carbon for each specimen was determined by carrying out the above measurement methods with respect to each of the semi-insulating GaAs single-crystal substrates of Specimen 1 to Specimen 4 and Specimens 101 to 106. The results are shown in Table 1 and Table 2. In Table 1 and Table 2, "(F)" in the item with respect to each of such characteristics means that the first main surface of the semi-insulating GaAs single-crystal substrate is derived from a first end surface of semi-insulating GaAs single crystal 81 (or ingot) and "(B)" in the item with respect to each of such characteristics means that the first main surface of the semi-insulating GaAs single-crystal substrate is derived from a second end surface of semi-insulating GaAs single crystal 81 (or ingot).

TABLE 1

| | Specimen 1 | Specimen 2 | Specimen 3 | Specimen 4 | Specimen 101 | Specimen 102 | Specimen 103 | Specimen 104 | Specimen 105 | Specimen 106 |
|---|---|---|---|---|---|---|---|---|---|---|
| Diameter | 152.4 | 152.4 | 101.6 | 202.5 | 101.6 | 152.4 | 152.4 | 152.4 | 152.4 | 202.5 |
| X (° C./mm) | 0.26 | 0.25 | 0.25 | 0.22 | 0.63 | 0.60 | 0.62 | 0.24 | 0.25 | 0.35 |
| Z2 (Y = 50) (° C./mm) | 0.36 | 0.35 | 0.36 | 0.32 | 1.28 | 1.39 | 1.35 | 0.50 | 0.40 | 0.62 |
| Z1 (Y = 100) (° C./mm) | 0.48 | 0.46 | 0.48 | 0.45 | 1.22 | 1.30 | 1.25 | 0.50 | 0.52 | 0.64 |
| EPD (F) ($cm^{-2}$) | 194 | 260 | 125 | 295 | 5900 | 6000 | 3000 | 427 | 416 | 850 |
| EPD (B) ($cm^{-2}$) | 173 | 98 | 89 | 283 | 6500 | 6800 | 4600 | 558 | 640 | 930 |
| Specific resistance ρ (F) ($\times 10^8 \Omega \cdot cm$) | 2.8 | 2.1 | 1.9 | 1.6 | 1.2 | 2.3 | 1.8 | 2.3 | 1.8 | 1.9 |
| Specific resistance ρ (B) ($\times 10^8 \Omega \cdot cm$) | 3.1 | 2.9 | 2.8 | 2.3 | 3.4 | 4.0 | 2.4 | 3.0 | 2.4 | 2.4 |

TABLE 1-continued

| | Specimen 1 | Specimen 2 | Specimen 3 | Specimen 4 | Specimen 101 | Specimen 102 | Specimen 103 | Specimen 104 | Specimen 105 | Specimen 106 |
|---|---|---|---|---|---|---|---|---|---|---|
| Coefficient of light absorption (F) ($cm^{-1}$) | 1.17 | 1.24 | 1.11 | 1.20 | 1.25 | 1.13 | 1.3 | 1.33 | 1.28 | 1.3 |
| Coefficient of light absorption (B) ($cm^{-1}$) | 1.05 | 1.21 | 1.24 | 1.12 | 1.30 | 1.29 | 1.22 | 1.23 | 1.15 | 1.35 |

TABLE 2

| | Specimen 1 | Specimen 2 | Specimen 3 | Specimen 4 | Specimen 10 | Specimen 102 | Specimen 103 | Specimen 104 | Specimen 105 | Specimen 106 |
|---|---|---|---|---|---|---|---|---|---|---|
| Electron mobility (F) ($cm^2/V \cdot s$) | 5500 | 6000 | 6300 | 6400 | 6300 | 5560 | 591 | 5200 | 6300 | 5900 |
| Electron mobility (B) ($cm^2/V \cdot s$) | 5300 | 5600 | 5600 | 5900 | 4800 | 4240 | 5800 | 4900 | 5900 | 5600 |
| Carrier concentration (F) ($\times 10^6 cm^{-3}$) | 4.2 | 5.9 | 6.8 | 6.8 | 9.1 | 5.0 | 6.3 | 5.2 | 6.3 | 6.3 |
| Carrier concentration (B) ($\times 10^6 cm^{-3}$) | 3.8 | 4.0 | 4.2 | 4.8 | 4.0 | 3.3 | 5.4 | 4.1 | 4.9 | 5.2 |
| Residual strain (F) ($\times 10^{-6}$) | 2.5 | 2.7 | 1.8 | 4.2 | 3.1 | 7.0 | 6.2 | 3.1 | 2.9 | 5.0 |
| Residual strain (B) ($\times 10^{-6}$) | 2.9 | 2.8 | 2.0 | 4.8 | 3.5 | 10.0 | 8.3 | 3.5 | 4.1 | 6.2 |
| EL2 concentration (F) ($\times 10^{15} cm^{-3}$) | 8.9 | 9.2 | 8.8 | 8.2 | 10,0 | 10.0 | 12.0 | 10.0 | 8.7 | 8.7 |
| EL2 concentration (B) ($\times 10^{15} cm^{-3}$) | 8.7 | 8.9 | 8.7 | 7.9 | 9.1 | 10.0 | 12.0 | 9.2 | 8.5 | 8.5 |
| Atomic concentration of carbon (F) ($\times 10^{15} cm^{-3}$) | 7.3 | 6.9 | 6.8 | 7.0 | 5.0 | 8.5 | 9.4 | 8.8 | 6.3 | 5.5 |
| Atomic concentration of carbon (B) ($\times 10^{15} cm^{-3}$) | 7.5 | 7.2 | 7.0 | 7.2 | 9.9 | 11.0 | 9.8 | 9.8 | 7.0 | 7.1 |
| Manufacturing yield (%) | 93 | 91 | 94 | 90 | 10 | 5 | 15 | 82 | 79 | 55 |

<Discussion>

In each of Specimen 1 to Specimen 4, the coefficient of light absorption of the GaAs single-crystal substrate with respect to near-infrared light at a wavelength of 940 nm was 1.5 $cm^{-1}$ or less, the EPD formed on the first main surface was 300 or less, and the specific resistance of the semi-insulating GaAs single-crystal substrate, as measured at 25° C. according to the Van der Pauw method, was $1.0\times10^8$ Ω·cm or more. It is understood from the foregoing that the semi-insulating GaAs single-crystal substrates 10 of Specimen 1 to Specimen 4 can serve as a semi-insulating GaAs single-crystal substrate suitable for an optical device demanded to have high transmission ability with respect to near-infrared light and low dislocation ability, such as a VCSEL. In particular, the semi-insulating GaAs single-crystal substrates of Specimen I to Specimen 4 can be expected to be significantly enhanced in manufacturing yield of VCSEL or the like, according to the values of the coefficient of light absorption and EPD. It is here understood that, even if the first main surface of the semi-insulating GaAs single-crystal substrate is derived from a first end surface of semi-insulating GaAs single crystal 81 or derived from a second end surface of semi-insulating GaAs single crystal 81, each of the characteristics in the first main surface is excellent at a comparable level. On the contrary, the semi-insulating GaAs single-crystal substrates of Specimens 101 to Specimen 106 were inferior in at least any characteristic of the above coefficient of light absorption with respect to near-infrared light at a wavelength of 940 nm, the EPD or the specific resistance, as compared with the semi-insulating GaAs single-crystal substrates of Specimen 1 to Specimen 4.

Example 2

<Production of VCSEL>

An infrared emission layer was placed by epitaxial growth, on the first main surface of each of the semi-insulating GaAs single-crystal substrates of Specimen 1 to Specimen 4 and Specimens 101 to 106 produced in Example 1, with a conventionally known method, to produce a vertical cavity surface emitting laser (VCSEL).

Specifically, an epitaxial structure was formed on the first main surface of the semi-insulating GaAs single-crystal substrate of each Specimen, by an organometallic vapor-phase epitaxy (OMVPE) method as an ordinary method, according to a method disclosed in Example 1 of Japanese Patent Laying-Open No. 2019-040953, Specifically, an epitaxial structure having a DBR region made of a p-type GaAs/p-type AlGaAs superlattice, a lower contact layer made of C-doped GaAs, a lower spacer layer made of AlGaAs, an infrared emission layer made of an InGaAs/GaAs quantum well structure, a DBR semiconductor region made of an n-type GaAs/AlGaAs superlattice, an upper portion spacer layer made of undoped GaAs, a current constriction layer made of Si-doped AlAs, a second DBR region made of an n-type GaAs/n-type AlGaAs superlattice, and an upper portion contact layer made of Si-doped GaAs in the listed order was formed on the first main surface. In particular, a quantum well structure made of an $In_xGa_{1-x}As$ (x=0.2) well layer having a thickness of nm and a GaAs barrier layer having a thickness of 7 nm, as an infrared emission layer, was grown 6 cycles. Thereafter, a device-making process such as electrode formation was performed for division to each chip of a size of 0.5 mm×0.5 mm as a chip interval, to obtain each VCSEL (hereinafter, also designated as "VCSELs of Specimen 1 to Specimen 4 and Specimens 101 to 106") corresponding to each of the semi-insulating GaAs single-crystal substrates of Specimen 1 to Specimen 4 and Specimens 101 to 106.

<Manufacturing Yield of VCSEL>

The VCSELs of Specimen 1 to Specimen 4 and Specimens 101 to 106 were each subjected to evaluation of initial characteristics and a high-temperature accelerated degradation test by burn-in. In the evaluation of initial characteristics, right and wrong were determined from the light output in application of the same amount of current. In the high-temperature accelerated degradation test, right and wrong were determined from the degree of degradation after accelerated degradation of any chip passed in the evaluation initial characteristics. Specifically, in the evaluation of initial characteristics, right and wrong were evaluated by the light output in application of a current of 6 mA in an on-wafer state before chip-making. In the high-temperature accelerated degradation test, right and wrong were evaluated by arbitrarily extracting 40 devices after chip-making, applying current at an applied current of 12 mA and an atmosphere temperature of 80° C. for 100 hours, and comparing characteristics after bringing back to room temperature with those before high-temperature acceleration. The final manufacturing yield was determined by expressing the product of the yields in both examinations, in percentage. The results are shown in Table 2.

<Discussion>

The VCSELs of Specimen 1 to Specimen 4 exhibited favorable manufacturing yields as compared with the VCSELs of Specimens 101 to 106. Therefore, the semi-insulating GaAs single-crystal substrates of Specimens 1 to 4 are supposed to be suitable for an optical device such as a VCSEL.

While embodiments and Examples of the present disclosure are described as above, an appropriate combination of configurations of each embodiment and Example is also originally expected.

Embodiments and Examples here disclosed are to be considered to be illustrative and not to be limitative in every respect. The scope of the present invention is indicated by not the above embodiments and Examples, but claims, and is intended to include all modifications within the meaning and scope equivalent to the scope of claims.

REFERENCE SIGNS LIST

1 Semi-insulating gallium arsenide single-crystal substrate (Semi-insulating GaAs single-crystal substrate), 11 First main surface, 11*a* Rectangular section, 11*b* Lattice, 100 Semi-insulating gallium arsenide single-crystal substrate (Semi-insulating GaAs single-crystal substrate), 21 Electrode, 200 Epitaxial layer, 210 First DBR layer, 220 Infrared emission layer, 230 Second DBR layer, 300 Substrate with epitaxial layer, Single crystal growth apparatus, 51 Crucible, 61 GaAs seed crystal, 71 Crucible holding stand, 73 Heating element, 75 Thermocouple, 81 Semi-insulating GaAs single crystal, 82 GaAs melt, 9 Straight body portion, O Center, OF Orientation flat, S10 Step of preparing single crystal growth apparatus, S20 Raw material-loading step, S30 Raw material-melting step, S40 Step of obtaining semi-insulating GaAs single crystal, S41 First growth step, S42 Second growth step, S43 Third growth step, S50 Cutting step, S60 Step of obtaining semi-insulating GaAs single-crystal substrate.

The invention claimed is:

1. A semi-insulating gallium arsenide single-crystal substrate having a circular-shaped first main surface, wherein a diameter of the semi-insulating gallium arsenide single-crystal substrate is 95 mm or more and 205 mm or less, a coefficient of light absorption of the semi-insulating gallium arsenide single-crystal substrate, with respect to near-infrared light at a wavelength of 940 nm, is 1.5 $cm^{-1}$ or less, the number of etch pits per square centimeter, formed on the first main surface, in an etching test with immersion of the semi-insulating gallium arsenide single-crystal substrate in molten potassium hydroxide at 500° C. for 10 minutes is 300 or less, and a specific resistance of the semi-insulating gallium arsenide single-crystal substrate, as measured at 25° C. in Hall measurement according to the Van der Pauw method, is $1.0\times10^8$ Ω·cm or more.

2. The semi-insulating gallium arsenide single-crystal substrate according to claim 1, wherein the coefficient of light absorption is determined by applying the near-infrared light at a wavelength of 940 nm to the semi-insulating gallium arsenide single-crystal substrate at an angle of 85 degrees to measure a transmittance and a reflectance of the near-infrared light, of the semi-insulating gallium arsenide single-crystal substrate, with an ultraviolet-visible-infrared spectrophotometer, and assigning a numerical value of the transmittance and a numerical value of the reflectance, and a numerical value of a thickness of the semi-insulating gallium arsenide single-crystal substrate to the following expression 1, expression 2 and expression 3, and is determined together with a reflectance in one reflection of the near-infrared light in the semi-insulating gallium arsenide single-crystal substrate:

$$R+R(1-R)^2\exp(-2\alpha d)/(1-r)=R^* \quad \text{Expression 1}$$

$$(1-R)^2\exp(-\alpha d)/(1-r)=T \quad \text{Expression 2}$$

$$r=R^2\exp(2\alpha d) \quad \text{Expression 3}$$

wherein, in the expression 1, expression 2 and expression 3,

R* represents a reflectance in consideration of multiple reflections, as measured with the ultraviolet-visible-infrared spectrophotometer, and a unit of the reflectance is dimensionless, $T^*$ represents a transmittance in consideration of multiple reflections, as measured with the ultraviolet-visible-infrared spectrophotometer, and a unit of the transmittance is dimensionless, $\alpha$ represents the coefficient of light absorption, and a unit of the coefficient of light absorption is $cm^{-1}$, R represents a reflectance in one reflection of the near-infrared light in the semi-insulating gallium arsenide single-crystal substrate, and a unit of the reflectance in one reflection is dimensionless, and d represents a thickness of the semi-insulating gallium arsenide single-crystal substrate, and a unit of the thickness is cm.

3. The semi-insulating gallium arsenide single-crystal substrate according to claim 1, wherein a carrier concentration in the semi-insulating gallium arsenide single-crystal substrate, as measured at 25° C. in Hall measurement according to the Van der Pauw method, is $8.0\times10^{6}$ $cm^{-3}$ or less, and an electron mobility of the semi-insulating gallium arsenide single-crystal substrate, as measured at 25° C. in Hall measurement according to the Van der Pauw method, is 4500 $cm^2/V\cdot s$ or more.

4. The semi-insulating gallium arsenide single-crystal substrate according to claim 1, wherein an average value of a residual strain, as an absolute value of a difference between a strain along a radial direction of the first main surface and a strain along a tangential direction of the first main surface, is $5.0\times10^{-6}$ or less.

5. The semi-insulating gallium arsenide single-crystal substrate according to claim 1, wherein an EL2 concentration of the semi-insulating gallium arsenide single-crystal substrate is $7.5\times10^{15}$ $cm^{-3}$ or more and $1.0\times10^{16}$ $cm^{-3}$ or less.

6. The semi-insulating gallium arsenide single-crystal substrate according to claim 1, wherein the semi-insulating gallium arsenide single-crystal substrate contains carbon, and an atomic concentration of the carbon in the semi-insulating gallium arsenide single-crystal substrate is $5.0\times10^{15}$ $cm^{-3}$ or more and $1.2\times10^{16}$ $cm^{-3}$ or less.

7. The semi-insulating gallium arsenide single-crystal substrate according to claim 1, to be used in a vertical cavity surface emitting laser.

8. A substrate with an epitaxial layer, the substrate comprising the semi-insulating gallium arsenide single-crystal substrate according to claim 1, and an epitaxial layer placed on the first main surface, wherein the epitaxial layer comprises an infrared emission layer.

9. A method for manufacturing a semi-insulating gallium arsenide single crystal by use of a vertical boat method, the manufacturing method comprising preparing a single crystal growth apparatus including at least a cylindrical crucible and a heating element that heats the crucible, providing a seed crystal at a bottom portion of the crucible and providing gallium arsenide bulk at an upper portion as compared with the seed crystal in the crucible, heating the crucible by the heating element to partially melt the gallium arsenide and the seed crystal, thereby not only obtaining a gallium arsenide melt, but also contacting the gallium arsenide melt and a residue of the seed crystal, and growing a crystal on the seed crystal in the gallium arsenide melt to obtain a semi-insulating gallium arsenide single crystal, wherein the obtaining a semi-insulating gallium arsenide single crystal is carried out with a relationship among the following formula 4, formula 5 and formula 6 being satisfied:

$$0.20°\ C./mm \leq X \leq 0.30°\ C./mm \quad \text{Formula 4}$$

$$X + 0.0012°\ C./mm^2 \times Y \leq Z1 \leq X + 0.0024°\ C./mm^2 \times Y \quad \text{Formula 5}$$

$$0.26°\ C./mm \leq Z2 \leq 0.42°\ C./mm \quad \text{Formula 6}$$

wherein, in the formula 4, formula 5 and formula 6,

X represents a temperature gradient along an axial direction of the crucible, as measured with, as a center, an interface between the crystal and the gallium arsenide melt, and a unit of the temperature gradient is C/mm, Y represents a distance from the interface to a first reference point in the crystal, and a unit of the distance is mm, Z1 represents a temperature gradient along an axial direction of the crucible, as measured with the first reference point as a center, and a unit of the temperature gradient is ° C./mm, and Z2 represents a temperature gradient along an axial direction of the crucible, as measured with, as a center, the first reference point at a distance from the interface to the first reference point, of 50 mm, and a unit of the temperature gradient is ° C./mm.

10. The method for manufacturing a semi-insulating gallium arsenide single crystal according to claim 9, wherein the single crystal growth apparatus comprises one or more thermocouples outside in a radial direction of the crucible, and position(s) of the thermocouple(s) is movable in a direction in parallel with an axial direction of the crucible.

11. The semi-insulating gallium arsenide single-crystal substrate according to claim 2, wherein a carrier concentration in the semi-insulating gallium arsenide single-crystal substrate, as measured at 25° C. in Hall measurement according to the Van der Pauw method, is $8.0\times10^{6}$ $cm^{-3}$ or less, an electron mobility of the semi-insulating gallium arsenide single-crystal substrate, as measured at 25° C. in Hall measurement according to the Van der Pauw method, is 4500 $cm^2/V\cdot s$ or more, an average value of a residual strain, as an absolute value of a difference between a strain along a radial direction of the first main surface and a strain along a tangential direction of the first main surface, is $5.0\times10^{-6}$ or less, an EL2 concentration of the semi-insulating gallium arsenide single-crystal substrate is $7.5\times10^{15}/cm^3$ or more and $1.0\times10^{16}$ $cm^{-3}$ or less, the semi-insulating gallium arsenide single-crystal substrate contains carbon, and an atomic concentration of the carbon in the semi-insulating gallium arsenide single-crystal substrate is $5.0\times10^{15}$ $cm^{-3}$ or more and $1.2\times10^{16}$ $cm^{-3}$ or less.

* * * * *